(12) United States Patent
Takahashi

(10) Patent No.: US 6,404,012 B1
(45) Date of Patent: Jun. 11, 2002

(54) SEMICONDUCTOR DEVICE HAVING A REVERSE CONDUCTIVE TYPE DIFFUSION LAYER IN AN EXTENDED DRAIN DIFFUSION LAYER

(75) Inventor: Kenichiro Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/190,448

(22) Filed: Nov. 13, 1998

(30) Foreign Application Priority Data

Nov. 13, 1997 (JP) ............................................. 9-311644
Jun. 17, 1998 (JP) ........................................... 10-169779

(51) Int. Cl.⁷ .......................... H01L 29/76; H01L 23/58
(52) U.S. Cl. ........................ 257/343; 257/488; 257/492
(58) Field of Search ................................ 257/328, 343, 257/409, 336, 369, 488, 489, 492, 493, 401

(56) References Cited

U.S. PATENT DOCUMENTS

| 4,300,150 | A |   | 11/1981 | Colak ........................... 257/336 |
| 4,811,075 | A |   | 3/1989  | Eklund ......................... 257/369 |
| 5,258,636 | A | * | 11/1993 | Rumennik et al. ........... 257/343 |
| 5,258,641 | A | * | 11/1993 | Kida et al. ................... 257/343 |
| 5,438,215 | A | * | 8/1995  | Tihanyi ........................ 257/401 |

FOREIGN PATENT DOCUMENTS

| JP | 55-108773 | 8/1980 | ................. 257/343 |
| JP | 4-107876 | 4/1992 | ................. 257/343 |
| JP | 4-107877 | * 4/1992 | ................. 257/343 |
| JP | 6-232392 | 8/1994 | ................. 257/343 |
| JP | 8-107202 | 4/1996 | ................. 257/343 |
| JP | 8-255913 | 10/1996 | ................. 257/343 |
| JP | 9-186242 | 7/1997 | ................. 257/492 |
| WO | WO 98/20562 | * 5/1998 | ................. 257/343 |

OTHER PUBLICATIONS

Koishikawa, Y., et al., "Double RESURF Device Technology for Power ICs," NEC Research and Development, vol. 35, No. 4, pp. 438–443, (Oct., 1994).

Sze, S.M., "Physics of Semiconductor Devices," 2nd Edition, pp. 105, (1981).

* cited by examiner

Primary Examiner—Steven Loke
(74) Attorney, Agent, or Firm—Foley & Lardner

(57) ABSTRACT

In a semiconductor device, a source diffusion layer is formed in a substrate, and a drain extended diffusion layer is formed in the substrate. A drain diffusion layer is formed in the extended drain diffusion layer. A reverse conductive type diffusion layer is formed adjacent to the drain diffusion layer in the extended drain diffusion layer. The reverse conductive type diffusion layer has a conductive type opposite to that of the extended drain diffusion layer. A main gate region is formed between the source diffusion layer and the drain extended diffusion layer on the substrate. A sub-gate region is formed between the reverse conductive type diffusion layer and the drain diffusion layer and on the extended drain diffusion layer.

14 Claims, 12 Drawing Sheets

SEMICONDUCTOR DEVICE HAVING A REVERSE CONDUCTIVE TYPE DIFFUSION LAYER IN AN EXTENDED DRAIN DIFFUSION LAYER

BACKGROUND OF THE INVENTION

This invention relates to a semiconductor device and a method of manufacturing the same.

An insulating gate type transistor (thereinafter, abbreviated as a MOSFET) for high breakdown voltage specification has generally a drain diffusion layer. In this event, the drain diffusion layer has a relatively low concentration and a long dimension (length) in a current direction. Herein, it is to be noted that the drain diffusion layer having such a structure will be thereinafter called an extended drain diffusion layer.

In this case, when the extended drain diffusion layer has high concentration, an on-resistance is reduced and conversely, a breakdown voltage between a drain region and a source region is lowered. This fact is true with respect to length of the extended drain diffusion layer in the current direction. Thus, there is a trade-off relationship between the breakdown voltage (between the source region and the drain region) and the on-resistance.

It is important in development of a device having a large power and a high breakdown voltage to realize a smaller on-resistance with the same breakdown voltage under a desired area occupied on a chip.

Various suggestions have been so far made to reduce the on-resistance.

One suggestion has been made about a MOSFET, which has a diffusion layer opposite to the extended drain diffusion layer. For instance, disclosure has been made about the MOSFET in which a diffusion layer having a reverse conductive type (thereinafter, referred to as a reverse conductive type diffusion layer) is formed in the extended drain diffusion layer, and the diffusion layer is set to the same potential with the source region in NEC Res.& Develop. Vol.35, No.4, October 1994 (thereinafter, called a first conventional reference).

Further, disclosure has been made about a MOS FET in which the above-mentioned reverse conductive type diffusion layer is put into an open state in Japanese Unexamined Patent Publication (JP-A) No. Sho. 55-108773 (thereinafter, called a second conventional reference). Such a MOS transistor has an excellent characteristic between a rated voltage and an on-resistance.

Moreover, the other various conventional techniques related to this invention have been known. For instance, disclosure has been made about "a lateral type field effect transistor having high breakdown voltage and a method of manufacturing the same" for improving the trade-off relationship between the breakdown voltage and the on-resistance of a lateral type MOSFET integrated in a power IC in Japanese Unexamined Patent Publication (JP-A) No. Hei. 8-107202 (thereinafter, called a third conventional reference). In the third conventional reference, a P-well region is formed on a surface layer of a p-type substrate, and an N-drain region including an N-offset region having a LOCOS layer is formed on the surface layer. Thus, the MOSFETS are structured according to the above disclosures.

However, the third conventional reference does not disclose the reverse conductive type diffusion layer at all, and is also different from structure of this invention.

In addition, disclosure has been made about a structure of a MOSFET, which has a high breakdown voltage and occupies a narrower area in comparison with the conventional structure in Japanese Unexamined Patent Publication (JP-A) No. Hei. 8-255913 (thereinafter, called a fourth conventional reference).

In the fourth conventional reference, a highly doped drain region is formed by doping substance of silicon via an opening portion of a field oxide film to save a silicon area and reduce an inherent resistance PDOSon. In this event, the field oxide film is obtained by the known selective/ anisotropy etching using a strip of a polysilicon which serves as a gate electrode and a field electrode as a mask.

However, the fourth conventional reference does not disclose the reverse conductive type diffusion layer at all, and also is different from the structure of this invention, like the third conventional reference.

Further, description has been made about a high voltage RESURF EDMOS transistor having bi-directional characteristic in Japanese Unexamined Patent Publication (JP-A) No. Hei 9-186242 (thereinafter, referred to as a fifth conventional reference). The fifth conventional reference can be mainly applied for a multiplexer having three inputs or more.

However, the fifth conventional reference does not disclose the reverse conductive type diffusion layer at all, and is also different from the structure of this invention, like the third conventional reference.

In the above-mentioned conventional references, the MOSFET inevitably has variation regarding electrical characteristic for reasons related to manufacturing process.

In the meanwhile, a pixel emits under high electrical field in a display which utilizes an electro-luminesance (EL) and a plasma display panel (PDP). Therefore, a scanning line electrode or a date line electrode has capacitance. Specifically, each of these electrodes has capacitance of several nF/line. This means that large capacitance is repeatedly and electrically charged and discharged. To this end, electric power is recovered during the discharge to suppress consumption power.

In such a recovering system, a diode is connected to an output terminal of a driving device. The electrical power is recovered from a forward direction current, which flows along the diode. It is required that the diode has considerably small resistance to recover the electric power. In addition, the diodes are required twice for the number of the electrodes.

Further, it is necessary that the diode is formed in a small-occupied area on the same chip as a semiconductor integrated circuit for driving so as to restrain manufacturing cost.

At the same time, the diode generally has a buried epitaxial structure and an insulator-separating structure formed by a complicated manufacturing process to prevent reduction of the electric power recovering efficiency due to an effect of a parasitic bipolar device during recovering the electric power.

SUMMARY OF THE INVENTION

It is therefore an object of this invention to provide a semiconductor device, which is capable o f suppressing variation of electrical characteristic and a method of manufacturing the same.

It is another object of this invention to provide a semiconductor device, which is suitable for miniaturization and a method of manufacturing the same.

It is still other object of this invention to provide a semiconductor device, which is capable of reducing operation resistance of a diode between a drain region and a source region and a method of manufacturing the same.

It is still other object of this invention to provide a semiconductor device which is capable of taking out a wire line from a reverse conductive type diffusion layer in an extended drain diffusion layer and using it as a independent terminal.

It is still other object of this invention to provide a semiconductor device, which is capable of reducing common-emitter direct current amplification factor and a method of manufacturing the same.

It is still other object of invention to provide a semiconductor device which has large degree of freedom of an electrode wiring pattern and a method of manufacturing the same.

It is still other object of this invention to provide a semiconductor device which has excellent reliability and yield and a method of manufacturing the same.

It is still other object of this invention to provide a driving device using the above-mentioned semiconductor device.

In a semiconductor device according to this invention, a source diffusion layer is formed in a substrate. Further, a drain extended diffusion layer is formed in the substrate. A drain diffusion layer is formed in the extended drain diffusion layer.

In this condition, a reverse conductive type diffusion layer is formed adjacent to the drain diffusion layer in the extended drain diffusion layer. In this event, the reverse conductive type diffusion layer has a conductive type opposite to that of the extended drain diffusion layer.

With such a structure, a main gate region is formed between the source diffusion layer and the drain extended diffusion layer and on the substrate. Moreover, a sub-gate region is formed between the reverse conductive type diffusion layer and the drain diffusion layer and on the extended drain diffusion layer.

In this case, the main gate region is composed of a main gate oxide film and a main gate electrode formed thereon while said sub-gate region is composed of a sub-gate oxide film and a sub-gate electrode formed thereon.

Further, a source electrode is placed on the source diffusion layer while a drain electrode is placed on the drain diffusion layer. Herein, the drain electrode contacts with the sub-gate electrode.

In addition, a terminal electrode is placed on the reverse type conductive layer. In this event, the terminal electrode is used as an independent terminal.

DESCRIPTION OF THE PREFERRED EMBODIMENT

Referring to FIGS. 1 and 2, conventional semiconductor devices will be first described for a better understanding of this invention. The semiconductor devices are equivalent to a part of the conventional semiconductor devices mentioned in the preamble of the instant specification.

An extended drain diffusion layer and a reverse conductive type diffusion layer in the extended diffusion layer (thereinafter, abbreviated as a reverse conductive type diffusion layer) are formed before a field oxide film is deposited in a method of manufacturing a MOSFET according to the first conventional reference illustrated in FIG. 1.

On the other hand, although the extended drain diffusion layer is formed before the field oxide film is deposited, the reverse conductive type diffusion layer is formed after a gate electrode is formed in a method of manufacturing the MOSFET according to the second conventional reference illustrated in FIG. 2.

First, description will be made about the MOS transistor according to the first conventional reference with reference to FIG. 1.

Figure 1A:
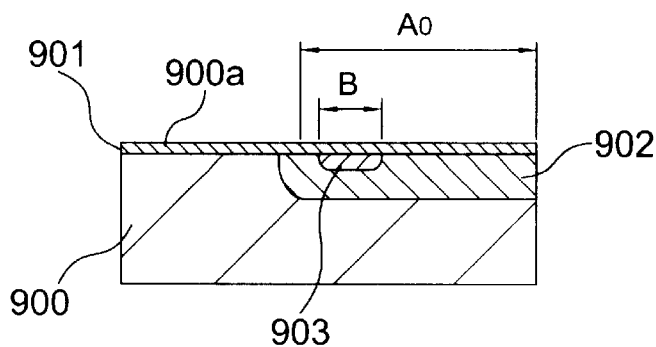
FIGS. 1A through 1E are cross sectional views showing a semiconductor device according to a first conventional reference.

A P-type silicon (Si) substrate 900 is first prepared, as shown in FIG. 1A. The P-type Si substrate is doped boron as a P-type impurity, and has a surface orientation of (100) and resistivity of 20 Ωcm. Herein, the P-type Si substrate 500 has a principle surface 900a.

Next, a thin oxide film 901 is deposited on the principle surface 900a of the P-type Si substrate 900. In this event, the oxide film 901 has a thickness of 40 nm. Thereafter, phosphorus ions are selectively doped as N-type impurities in a portion indicated by $A_0$ in the P-type Si substrate 900, as illustrated in FIG. 1A. Subsequently, annealing process is carried out to remove lattice defects formed by the ion doping process. Thereby, an N-type diffusion layer 902 is formed in the P-type Si substrate 900. Herein, it is to be noted that the N-type diffusion layer 902 is called an extended drain diffusion layer.

Subsequently, boron ions are selectively doped as P-type impurities in a portion indicated by B in the N-type diffusion layer 902. Annealing process is carried out to remove the lattice defects formed by the ion doping process. Thereby, a P-type diffusion layer 903 is formed in the N-type diffusion layer 902. The P-type diffusion layer 903 serves as the reverse conductive diffusion layer in the extended diffusion drain.

Figure 1B:
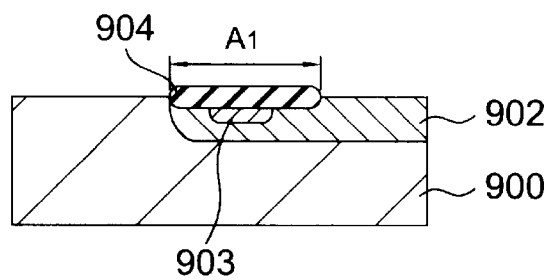

Next, a field oxide film 904 is formed by oxidizing the preselected potion (a portion indicated by A1) on the N-type diffusion layer 902 by the use of the known LOCOS (Local Oxidation Of Silicon) method after the oxide film 901 is removed, as illustrated in FIG. 1B. Herein, the field oxide film 904 has the thickness of 1.2 µm.

Figure 1C:
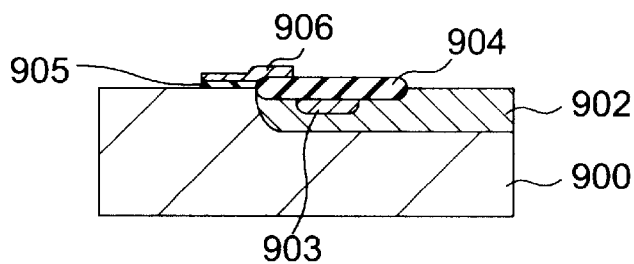

Thereafter, a gate oxide film 905 is deposited on the principle surface 900a of the P-type Si substrate 900, as illustrated in FIG. 1C. In this event, the gate oxide film 505 has the thickness of 400 nm. Thereafter, a polysilicon film 906 is formed on the gate oxide film 905. Herein, the polysilicon film has the thickness of 0.4 µm. Further, the polysilicon film 906 is selectively etched. Consequently, the polysilicon film 906 is left on the gate oxide film 905 and a part of the field oxide film 904.

Successively, the anisotropy etching process is carried out with the thickness of the gate oxide film 905 to leave only the gate oxide film 905 below the polysilicon film 906.

Figure 1D:
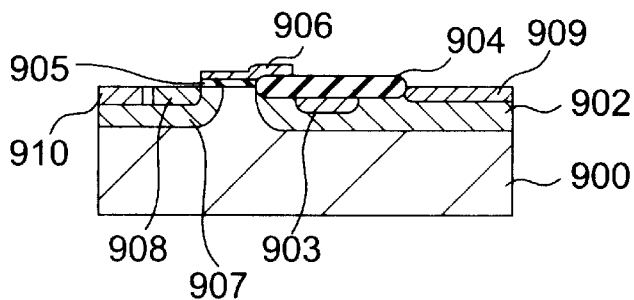

Next, a DSA (diffusion-self alignment) diffusion layer 907 is formed by doping boron ions to structure a source region, as shown in FIG. 1D. Thereafter, the annealing process is carried out to remove the lattice defects. Subsequently, an N$^+$ layer 909, an N$^+$ layer 908 and a P$^+$ layer 910 are formed by doping phosphorus, phosphorus and boron with high concentration into a drain region of the N-type diffusion layer 902, a source region of the DSA layer 907, and a back gate contact region of the DSA diffusion layer 907, respectively.

Figure 1E:
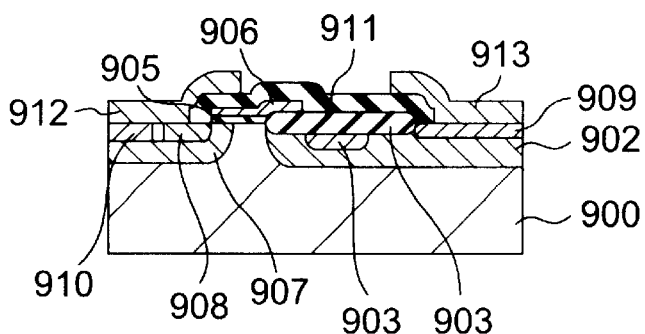

Subsequently, an interlayer insulating film 911 is selectively formed so as to cover the field oxide film 904 and the polysilicon film 906. Further, aluminum wiring patterns 912 and 913 are selectively formed on the source region and the drain region, as illustrated in FIG. 1E. As shown in FIG. 1E, the aluminum wiring patterns 912 and 913 and the polysilicon film 906 serve as the source electrode, the drain electrode and the gate electrode, respectively.

Subsequently, description will be made about a method of manufacturing the MOS transistor according to the second conventional reference with reference to FIG. 2.

Figure 2A:
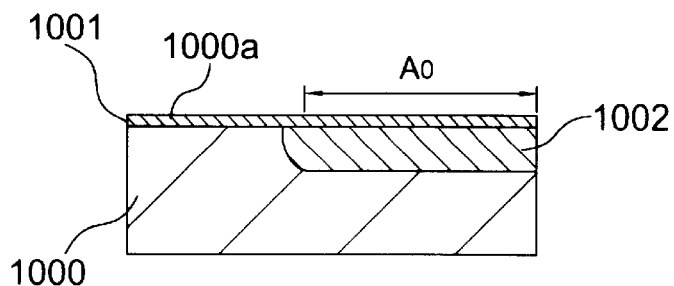
FIGS. 2A through 2E are cross sectional views showing a semiconductor device according to a second conventional reference.
Figure 2B:
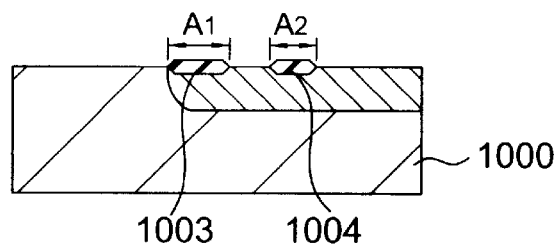

A P-type silicon (Si) substrate 1000 is first prepared, as shown in FIG. 2A. The P-type Si substrate 1000 is doped boron as a P-type impurity, and has a surface orientation of (100) and resistivity of 20 Ωcm. Herein, the P-type Si substrate 1000 has a principle surface 1000a.

Next, a thin oxide film 1001 is deposited on the principle surface 1000a of the P-type Si substrate 1000. In this event, the oxide film 1001 has a thickness of 40 nm. Thereafter, phosphorus ions are selectively doped as N-type impurities in a portion indicated by $A_0$ in the P-type Si substrate 1000, as illustrated in FIG. 1A. Next, an annealing process is carried out to remove lattice defects formed by the ion doping process. Thereby, an N-type diffusion layer 1002 is formed in the P-type Si substrate 1000. Herein, it is to be noted that the N-type diffusion layer 1002 is called an extended drain diffusion layer.

Thereafter, first and second field oxide films 1003 and 1004 are formed by oxidizing the preselected first and second portions (portions indicated by A1 and A2) in the N-type diffusion layer 1002 by the use of the LOCOS process after the oxide film 1001 is removed, as illustrated in FIG. 2A. Herein, each of the first and second field oxide films 1003 and 1004 has the thickness of 1.2 µm. In this event, the first field oxide film 1003 is formed near an end portion of the N-type diffusion layer 1002. On the other hand, the second field oxide film 1004 is formed near a center portion of the N-type diffusion layer 1002 apart from the first field oxide film 1003.

Figure 2C:
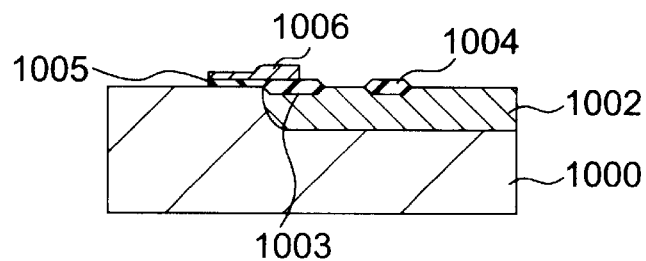

Next, a gate oxide film 1005 is deposited on the principle surface 1000a of the P-type Si substrate 1000, as shown in FIG. 2C. In this case, the gate oxide film 1005 has the thickness of 400 nm. Thereafter, a polysilicon film 1006 is deposited on the gate oxide film 1005. Herein, the polysilicon film 1006 has the thickness of 0.4 µm. Further, the polysilicon film 1006 is selectively etched. Consequently, the polysilicon film 1006 is left on the gate oxide film 1005 and a part of the filed oxide film 1003.

Moreover, the anisotropy etching process is carried out with the thickness of the gate oxide film 1005 so as to leave only the gate oxide film 1005 below the polysilicon film 1006.

Figure 2D:
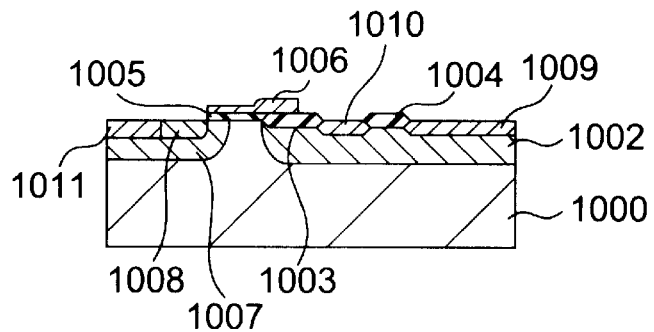

Subsequently, a DSA (diffusion-self alignment) diffusion layer 1007 is formed by doping boron ions to structure a source region, as shown in FIG. 2D. Thereafter, the annealing process is carried out to remove lattice defects.

Next, an N$^+$ layer 1008, an N$^+$ layer 1009, a P$^+$ layer 1010 and a P$^+$ layer 1011 are formed by doping phosphorus, phosphorus, boron and boron with high concentrations into a source region of the DSA layer 1007, a drain region of the N-type diffusion layer 1002, a reverse conductive type diffusion layer (a portion interposed between the first and second field oxide films 1003 and 1004) of the N-type diffusion layer 1002 and a back gate contact portion of the DSA diffusion layer 1007, respectively.

In this event, the N$^+$ layer 1009 is called a drain high concentration diffusion layer while the P$^+$ layer 1010 is called a reverse conductive type diffusion layer.

Figure 2E:
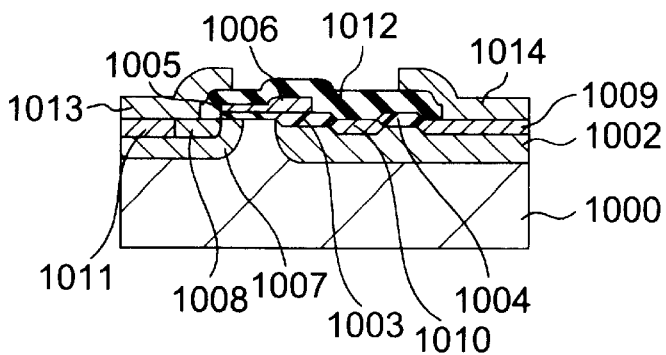
Figure 3:
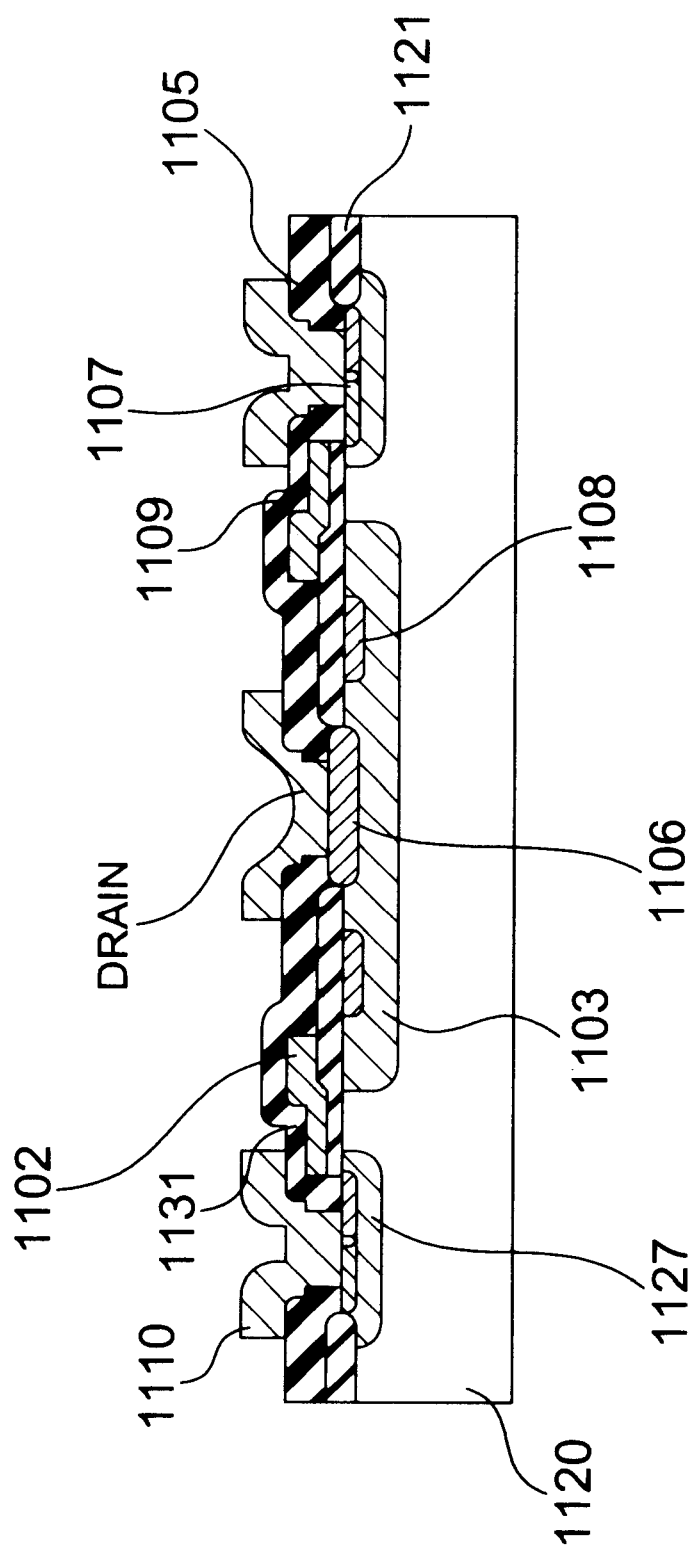
FIG. 3 is a cross sectional view showing the conventional semiconductor device.

Thereafter, an interlayer insulating film 1012 is selectively formed so as to cover the first and second field oxide films 1003 and 1004, the P$^+$ layer 1010 and the polysilicon film 1006, as illustrated in FIG. 2E. Further, aluminum wiring patterns 1013 and 1014 are selectively formed on the source region and the drain region, as illustrated in FIG. 2E. As shown in FIG. 2E, the aluminum wiring patterns 1013, 1014 and the polysilicon film 1006 serve as the source electrode, the drain electrode and the gate electrode, respectively.

However, the above-mentioned first and second conventional references have the following problems.

First, description will be made about common problems related to the first and second conventional reference illustrated in FIGS. 1 and 2.

The extended drain diffusion layers 902 and 1002 are designed with low concentration so that they are completely depleted in an off state. In this condition, the oxide film having the thickness same as each of the field oxide films 904, 1003 and 1004 is required to stabilize potential distribution of the depletion portion and to eliminate an adverse affect from an upper portion when the extended drain diffusion layers 902 and 1003 are depleted in the off-state.

On the other hand, each of the gate oxide films 905 and 1005 is thinly designed as possible in a permitted range of an insulating breakdown voltage to improve electric characteristics, such as, mutual conductance and on-resistance. In general, each of the gate oxide films 905 and 1005 considerably be come thinner than each of the field oxide films 904, 1003 and 1004.

In consequence, an end portion of each of the field oxide films 904, 1003 and 1004 (namely, bird's beak of the LOCOS layer) is inevitably formed between the gate region and the drain region. Such an end portion of the oxide film (bird's beak) requires a desired dimension and an overlap quantity with polysilicon film 906, 1005.

Further, stress is concentrated to the bird's beak. Consequently, heavy metal, which is trapped in the manufacturing process, is collected in the bird's beak. As a result, resistance to the electrical field becomes small, and the yield is also degraded.

Moreover, the extended drain diffusion layer 902 and 1002 are formed at relatively initial stage before the field oxidation is carried out. Consequently, a profile of the impurity is largely varied after manufacturing. More specifically, the high temperature process such as the field oxidation and the gate oxidation are performed after the extended drain diffusion layers 902 and 1002 are formed. In particular, the impurity is boron in a PMOS. As a result, the boron is absorbed in the oxide film during oxidation to increase the variation.

Subsequently, description will be made about problems inherent to the first conventional reference illustrated in FIG. 1.

The reverse conductive diffusion layer 903 is formed before the field oxide film 904 is deposited. Consequently, the profile of the impurity is largely varied after manufacturing. Further, a positioning relationship between the drain high concentration diffusion layer 909 and the gate region is determined by the same mask step. In consequence, a relative positioning accuracy is completely ensured. On the other hand, a mask step for determining the reverse conductive diffusion layer 903 is carried out by the use of the other mask. As a result, the positioning relationship between the diffusion layer, the high concentration drain diffusion layer 909, and the gate region is determined by taking deviation permitted by the manufacturing process into consideration. In this case, when the reverse conductive diffusion layer 903 is deviated to a side of the drain high concentration diffusion layer 909, the breakdown voltage between the drain high concentration diffusion layer 909 and the reverse conductive diffusion layer 903 is reduced. On the other hand, the reverse conductive diffusion layer 903 is deviated to a side of the gate region, the breakdown voltage between the source and the drain is reduced.

Subsequently, description will be made about problems inherent to the second conventional reference illustrated in FIG. 2.

The reverse conductive diffusion layer 1010 in the extended drain diffusion layer 1002 has a stable impurity concentration profile because it is formed after the gate structure is completed. Further, the positioning relationship between the gate region, the reverse conductive diffusion layer 1010, and the drain high concentration diffusion layer 1009 is determined by the same mask step. Consequently, the relative accuracy of the positioning relationship is ensured.

However, two bird's beaks of the LOCOS layer are placed in the extended drain diffusion layer 1002 that is put into high electric field in the off-state. In consequence, the manufacturing yield is reduced. Moreover, the dimension of the device is further enlarged by taking the bird's beaks into account.

Taking the above-mentioned problems into consideration, this invention provides a semiconductor device which is capable of suppressing variation of electrical characteristic.

(First Embodiment)

Referring to FIG. 4, description will be made about a method of manufacturing a semiconductor device according to a first embodiment of this invention. Herein, the semiconductor device corresponds to an NMOS transistor having a rated voltage of 60V.

Figure 4A:
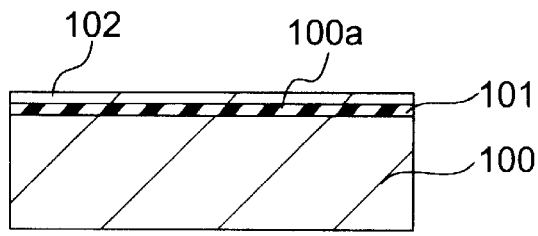
FIGS. 4A through 4E are cross sectional views showing a semiconductor device according to a first embodiment according to this invention.

A P-type silicon (Si) substrate (thereinafter, abbreviated as a silicon substrate) 100 is first prepared as shown in FIG. 4A. The P-type Si substrate 100 is doped boron, and has a surface orientation of (100) and resistivity of 20 Ωcm. Herein, the P-type Si substrate 100 has a principle surface 100a. An oxide film 101 having a thickness of 0.2 μm as a gate oxide film is formed on the principle surface 100a of the silicon substrate 100. Thereafter, a polysilicon film 102 as a gate electrode is deposited to the thickness of 0.4 μm. Further, phosphorus is doped with high concentration by the use of the thermal diffusion method to reduce resistivity of the polysilicon film 102.

Figure 4B:
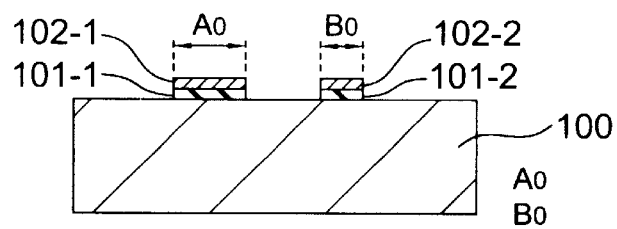

Successively, the polysilicon film 102 and the oxide film 101 are removed by etching by the use of the known photolithography except a main gate region (a portion indicated by A0) and a sub-gate region (a portion indicated by B0), as illustrated in FIG. 4B. Thereby, a first polysilicon film 102-1 and a first oxide film 101-1 are left on the main gate region $A_0$ while a second polysilicon film 102-2 and a second oxide film 101-2 are left on the sub-gate region B0. In this event, the first polysilicon film 102-1 is used as a main gate electrode while the second polysilicon film 102-2 is used as a sub-gate electrode.

Herein, it is to be noted that the first oxide film 101-1 is called a main gate oxide film and the second oxide film 101-2 is called a sub-gate oxide film.

Figure 4C:
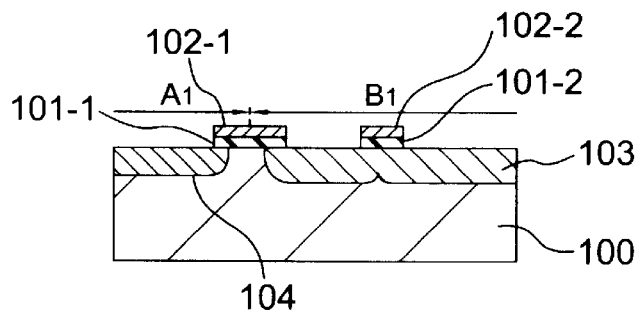

As shown in FIG. 4C, the silicon substrate 100 is divided into an A1 portion of a source side and a B1 portion of a drain side by positioning a center of the main gate region A0 as a border. With such a structure, the A1 portion is covered with a photo-resist film (not shown) by the use of the photo-resist method. Under this condition, phosphorus ions are doped and diffused to form an N-type extended drain diffusion layer 103 in the B1 portion of the silicon substrate 100.

Namely, the N-type drain diffusion layer 103 is formed in the self-alignment manner using a tip portion of the main gate electrode 102-1 as a mask.

Thereafter, the B1 portion is covered with a resist film (not shown) by the use of the photolithography. In this condition, boron ions are doped and diffused to form a P-type DSA (diffusion-self alignment) diffusion layer 104, as shown in FIG. 4C.

Figure 4D:
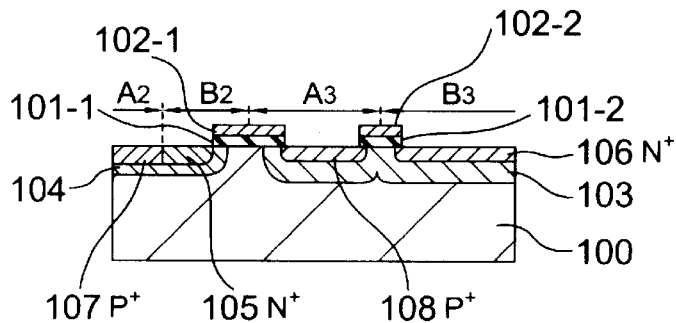

As shown in FIG. 4D, the A1 portion (the P-type DSA diffusion layer 104) is divided into an A2 portion apart from the main gate region A0 and a B2 portion adjacent to the main gate region. Further, the B1 portion (the N-type extended drain diffusion layer 103) is divided into an A3 portion adjacent to the main gate region A0 and a B3 portion apart from the main gate region by using a center of the sub-gate region B0 as a border.

Thereafter, high concentration layers are formed on the surface by using the resist film formed by the photolithography and the first and second polysilicon films 102-1 and 102-2 as a mask for the ion doping process.

Specifically, arsenic ions are doped into the B2 portion and the B3 portion by using the A2 portion and A3 portion as a mask to form high concentration diffusion layer (an $N^+$ layer) 105 and an $N^+$ layer 106. Likewise, boron ions are doped into the A2 portion and the A3 portion by using the B2 portion and the B3 portion as a mask to form a high concentration P-type diffusion layer (a $P^+$ layer) 107 and a $P^+$ layer 108.

In this event, the high concentration P-type diffusion layer 108 is called a reverse conductive diffusion layer while the high concentration N-type diffusion layer 106 is called a drain high concentration diffusion layer or a high concentration drain diffusion layer.

Namely, the reverse conductive diffusion layer 108 is formed in the self-alignment manner between the main gate electrode 102-1 and the sub-gate electrode 102-2. Further, the N⁺ layer 106 is formed in the self-alignment manner with the sub-gate electrode 102-2.

Figure 4E:
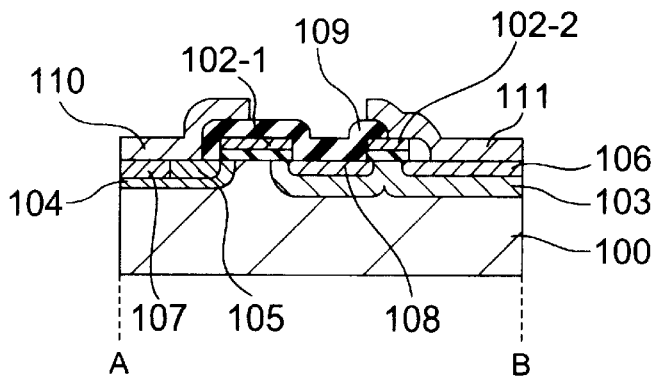

Subsequently, an oxide-based insulating film 109 is deposited on the entire surface, and the insulating film 109 is selectively etched by the use of the photolithography method, as illustrated in FIG. 4E. Thereby, the remained insulating film 109 covers the entire surface of the first polysilicon film (the main gate electrode) 102-1, the reverse conductive diffusion layer 108, a part of the surface of the second polysilicon film 102-2 (the sub-gate electrode), and a sidewall of the second oxide film (the sub-gate oxide film) 101-2.

Thereafter, aluminum is deposited on the entire surface, and the aluminum is selectively etched by the use of the photolithography method to form aluminum wiring patterns 110 and 111 on the surface. In this event, the aluminum wiring pattern 110 contacts with the high concentration N-type diffusion layer 105 and the high concentration P-type diffusion layer 107 while the aluminum wiring pattern 111 contacts with the drain high concentration diffusion layer 106.

Namely, the aluminum wiring pattern 110 serves as the source electrode while the aluminum wiring pattern 111 serves as the drain electrode. In this case, the aluminum wiring pattern also contacts with the sub-gate electrode 102-2.

Subsequently, description will be made about dimension of main portions of the above-mentioned semiconductor device.

The main gate electrode 102-1 has a gate length of 5 μm. This dimension is selected as a minimum value within the range for avoiding that the depletion layer extended from the extended drain diffusion layer 103 reaches the source diffusion layer so as to occur punch-through.

Further, a distance between the main gate electrode 102-1 and the sub-gate electrode 102-2 is set to about 5 μm. When the MOS transistor is put into the off state, the depletion layer grows from both the reverse conductive diffusion layer 108 and the P-type silicon substrate 100 to occur the pinch-off state. In this condition, the extended drain diffusion layer 103 is entirely depleted. The above-mentioned dimension is selected to a minimum value within the range that the depleted portion is not broken down by exceeding critical electrical field.

The sub-gate electrode 102-2 has dimension of about 3 μm. This dimension is set to a minimum value in the range that the breakdown does not occur between the reverse conductive diffusion layer 108 and the drain high concentration diffusion layer 106.

The diffusion structure of this portion is structured by the high concentration P-type diffusion layer (namely, the reverse conductive diffusion layer) 108, the N-type diffusion layer 103 (namely, the extended drain diffusion layer) having low to intermediate concentration, and the high concentration N-type diffusion layer (namely, the drain high concentration layer) 106. In this event, the concentration dependency of the diffusion layer having low to intermediate concentration does not almost appear because the extended drain diffusion layer 103 is completely depleted (for example, see S. M. Sze, Physics of Semiconductor Devices 2nd Edition, pp.105, FIG. 32).

Therefore, the concentration of the extended drain diffusion layer 103 is practically determined by only dimension of the sub-gate electrode 102-2.

The drain electrode 111, the source electrode 110 and the main gate electrode 102-1 are taken out to the external of the semiconductor device via wiring lines from the surface, like the conventional MOS transistor. Further, the sub-gate electrode 102-2 contacts with the aluminum wiring pattern (namely, drain electrode) 111 at a part of the device. Thereby, the sub-gate electrode is fixed to the same potential as the drain region.

A wiring line may not be taken out from the reverse conductive diffusion layer 108 to supply electrical power in accordance with applicable field. Consequently, the reverse conductive diffusion layer 108 serves as a floating diffusion layer.

Alternatively, the reverse conductive diffusion layer 108 may be fixed to the same potential as the source region by taking out a wiring electrode to the external of the semiconductor device.

The above-mentioned embodiment has the following features. Namely, the sub-gate electrode 102-2 is formed simultaneously with the main gate electrode 102-1. Further, when the extended drain diffusion layer 103 is formed, at least the tip portion thereof is formed in the self-alignment manner with the main gate electrode 102-1.

Moreover, the reverse conductive diffusion layer 108 is formed in the self-alignment manner by using the main gate electrode 102-1 and the sub-gate electrode 102-2 as the mask.

Subsequently, description will be made about an operation of the thus-fabricated MOSFET.

Backward bias is applied to the reverse conductive diffusion layer 108 and the extended drain diffusion layer 103 in the off state. Thereby, the depletion layer grows in the extended drain diffusion layer 103 from the side of the reverse conductive diffusion layer 108 (namely, an upper side) in addition to the side of the semiconductor substrate 100 (namely, lower side).

In consequence, when the same breakdown voltage is ensured, the extended drain diffusion layer 103 can have higher concentration as compared to the case that the depletion layer grows from only the lower side. Thereby, the on-resistance can be reduced.

In addition, the extended drain diffusion layer 103 having relatively low concentration is exposed to the surface between the drain high concentration diffusion layer 106 and the reverse conductive diffusion layer 108. The second oxide film 101-2 and the second polysilicon film 102-2 are formed on the exposed portion. Thereby, a stable MOS structure can be realized to serve as a shield portion against external electrical field.

Further, the MOS structure also serves as a field plate for stably determining electrical distribution of the low concentration diffusion layer.

Subsequently, description will be made about effects of the first embodiment of this invention.

(1) Stabilization of characteristic (a) The plan structure consisting of the source region 105, the gate regions A0 and B0, the extended drain diffusion layer 103, the reverse conductive diffusion layer 108, and the drain high concentration diffusion layer 106 is determined by only the mask step for forming the polysilicon film 102. Thereby, the plan arrangement structure of high accuracy can be realized. As a result, variation of electrical characteristic can be suppressed according to this embodiment.

In contrast, the gate region, the extended drain diffusion layer, the reverse conductive diffusion layer and the drain high concentration layer are conventionally formed by the use of the independent mask steps, respectively.

(b) All of the extended drain diffusion layer 103, the reverse conductive diffusion layer 108 and the drain high concentration diffusion layer 106 are formed in a final step having no thermal process in the diffusion process after the MOS gate structure is completed. Thereby, a final impurity profile of high accuracy can be obtained in each of the diffusion layers. As a result, the variation of the electrical characteristic can effectively be restrained.

In contrast, at least the extended drain diffusion layer must be conventionally formed before the field oxide step. Consequently, the accuracy of the final impurity profile is degraded because of the subsequent series of thermal processes.

(c) The extended drain diffusion layer 103 of low concentration is exposed on the surface 100a of the silicon substrate 100 in the sub-gate region B0 between the reverse conductive diffusion layer 108 and the drain high concentration diffusion layer 106. As a result, this portion constitutes the stable MOS structure. In consequence, the potential of the polysilicon film can be fixed to the same potential as the drain. Thereby, a shield effect can be obtained so as to eliminate an adverse effect in the case that a package is charged. In addition, the MOS structure itself serves as the field plate of high accuracy.

In contrast, the depletion diffusion layer of low concentration must be conventionally covered with the field oxide film near the silicon surface.

(2) Miniaturization

As mentioned before, it is clear that the miniaturization is achieved from the above-mentioned item (a) and (b). Further, as illustrated in FIG. 4, the semiconductor device has a flat structure having no bird's beaks of the LOCOS layer between the source region and the center portion of the drain. Such a structure is suitable for the miniaturization.

(3) Reduction of operation resistance of a diode between the drain region and the source region The MOS transistor is often used as a switching device in application for driving a load. At the same time, the diode formed between the drain region and the source region is positively used when a current flows in a reverse direction.

Such a driving method is used for an output transistor in a driving IC of an EL display or a plasma display. With such a structure, the reverse conductive diffusion layer 108 is coupled with the source electrode 110 via the metal wiring pattern of low resistance.

Alternatively, the reverse conductive diffusion layer 108 is used as an independent terminal of the diode. Herein, the terminal corresponds to an anode electrode in the NMOS transistor while it corresponds to a cathode electrode in the PMOS transistor. Thereby, the operation resistance can be reduced to a logical limit. This is because a distance the reverse conductive layer 108 and the drain high concentration diffusion layer 106 can be set to the minimum value with high accuracy as compared to the conventional case. In this event, this distance is required to ensure the breakdown voltage.

(4) The wiring line is taken out from the reverse conductive layer 108 to use as an independent terminal As mentioned after, the wiring can be readily taken out and drawn around because degree of freedom of the wiring line is large. Therefore, the terminal can be easily dealt with independently from the reverse conductive layer 108. For instance, the terminal can be directly used as a power recovery terminal for driving the EL plasma display.

(5) Reduction of common-emitter current amplification factor $h_{FE}$ of parasitic bipolar transistor (improvement of the latch-up breakdown voltage and improvement of power recovery efficiency in the EL/PDP display drive)

On a semiconductor substrate of a first conductive type, a well-diffusion layer of a second conductive layer is formed. In this well of the second conductive type, the MOS transistor of the first conductive type according to this invention is structured. With such a structure, the extended drain diffusion layer of the first conductive type constitutes an emitter, the well diffusion layer of the second conductive type constitutes a base and the semiconductor substrate of the first conductive type constitutes a collector. Thus, the parasitic bipolar transistor is structured, and the common-emitter current amplification factor $h_{FE}$ can be suppressed to a lower value.

This is because even when minority carriers are injected from the extended drain diffusion layer of the first conductive type into the well diffusion layer of the second conductive type, most of the minority carriers do not move to the semiconductor substrate of the first conductive type and are recovered in the reverse conductive diffusion layer. Thereby, the power is supplied into the reverse conductive diffusion layer. As a result, the recovery efficiency can be further enhanced according to this invention.

(6) The degree of freedom of the electrode-wiring pattern is large

The surface of the semiconductor device according to this invention is occupied by the regions (the main gate region A0 and the sub-gate region B0) of the polysilicon film 102 which is fixed the potential and the high concentration region of about $10^{20}$/cubic centimeter or more which is not almost depleted.

With such a structure, the depletion occurs in the off-state, and the extended drain diffusion layer 103, which serves as the electrical field drift region, is formed below them. Therefore, affect due to electric line of force from a mold resin caused by the aluminum wiring patterns 100 and 111 or charge on the surface is not required to be considered. Consequently, it is possible to wire the electrode on the condition that the restrain is released. Naturally, a shield aluminum, which is formed to protect an error operation of the device when the mold resin is strongly charged, is also unnecessary.

(7) Excellent reliability/yield

In the conventional semiconductor device manufactured by the method for forming the reverse conductive diffusion layer from an opening portion of a thick oxide film, such as, the field oxide film, strong electrical filed is applied for the oxide film step portion, such as, the bird's beak of the LOCOS layer when the MOS FET is put into the off-state. In consequence, the yield and reliability is reduced.

Specifically, strong stress is applied for the oxide film step portion, such as, the bird's beak of the LOCOS layer. Further, heavy metal, which is introduced as contamination substance during fabrication, is readily trapped for the portion in which the stress is applied. Consequently, resistance to electrical field destruction breakdown voltage is reduced.

In contrast, as mentioned before, the semiconductor device according to this invention has the flat structure having no bird's beak of the LOCOS layer between the source region and the center portion of the drain region. As a result, the yield and reliability are largely improved.

Figure 5:
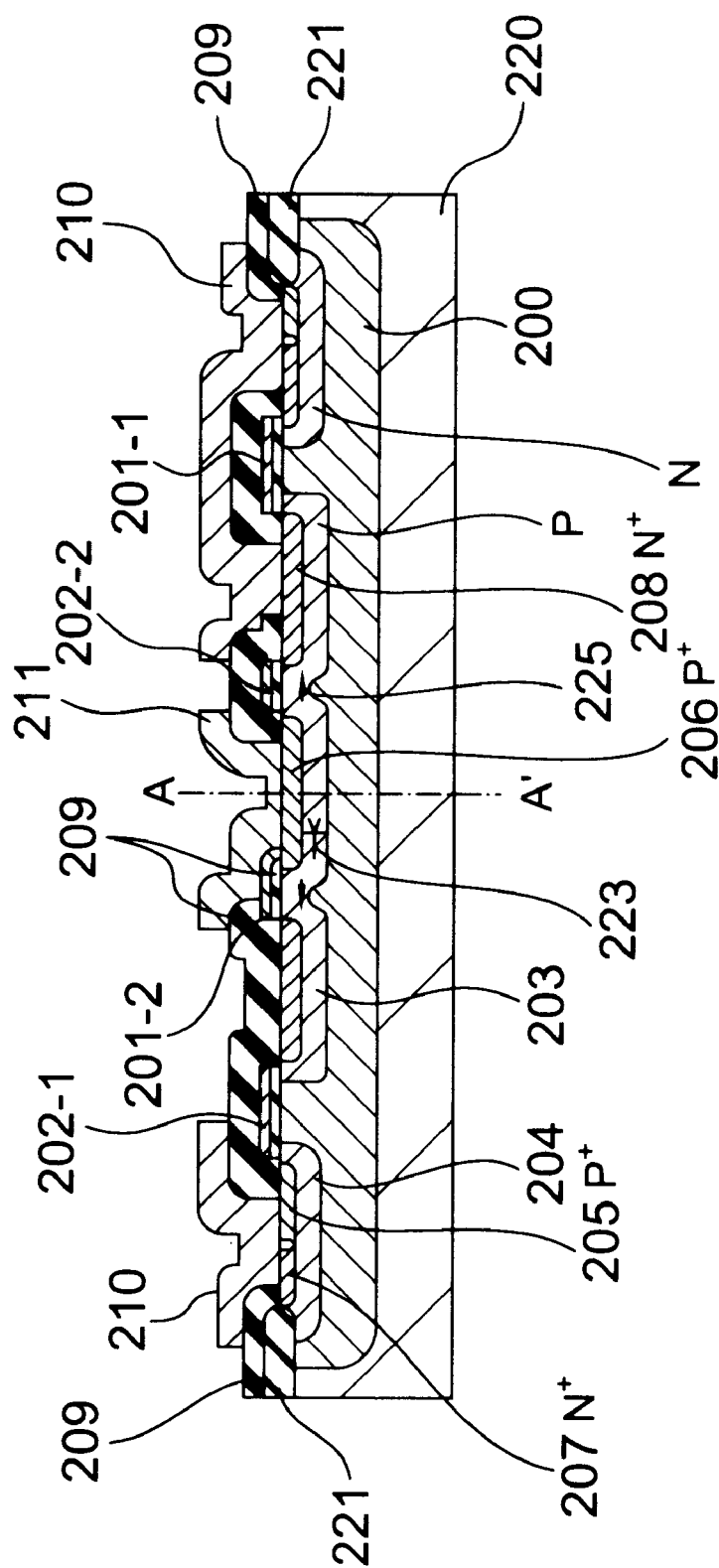
FIG. 5 is a cross sectional view showing a semiconductor device according to a second embodiment of this invention.

Referring to FIG. 5, description will be made about a semiconductor device according to a second embodiment of this invention.

The semiconductor device illustrated in FIG. 5 is formed on the same semiconductor substrate as the MOSFET illustrated in FIG. 4 that constitutes a CMOS structure with the NMOS transistor illustrated in FIG. 4 except that a PMOS transistor is formed instead. Therefore, the rated voltage is equal to 60V, like the NMOS transistor illustrated in FIG. 4.

A relatively deep N-well layer 200 of about 10 μm is formed in a P-type silicon substrate 220 (namely, P-type substrate), and a PMOS transistor is formed in the N-well layer 200, different from the NMOS transistor illustrated in FIG. 4. Naturally, the conductive types of the respective diffusion layers which constitute the device is reversed against the N-type illustrated in FIG. 4. Namely, the P-type is changed into the N-type while the N-type is changed into the P-type.

Further, the PMOS transistor illustrated in FIG. 5 substantially has a symmetrical structure using an axis A–A' as a center. The structure corresponds to circular shape or rectangular shape in a plan arrangement. Namely, the transistor has a complete symmetrical structure except aluminum wiring pattern and a surface insulating film. In other words, the aluminum wiring pattern and the surface insulating film has the symmetrical structure except restraint regarding wiring connection or electrode withdrawing.

More specifically, as shown in FIG. 5, a P-type extended drain diffusion layer 203 is formed at a center portion of the N-well 200. Further an N-type DSA diffusion layer 204 is formed at the peripheral portion. In this event, a high concentration P-type diffusion layer ($P^+$ layer) 205 and a high concentration N-type diffusion layer ($N^+$ layer) 207 are formed in the N-type DSA diffusion layer 204.

Herein, it is to be noted that the high concentration N-type diffusion layer 208 is called the reverse conductive layer while the high concentration P-type diffusion layer 206 is the drain high concentration diffusion layer or the high concentration diffusion layer.

Further, an annular first oxide film 201-1 (a main gate oxide film) and a first polysilicon film (a main gate electrode) 202-1 are formed on a surface of the N-well layer 200 between the P-type extended drain diffusion layer 203 and the N-type DSA diffusion layer 204.

Moreover, a second oxide film (a sub-gate oxide film) 201-2 and a second polysilicon film (a sub-gate electrode) 202-2 are formed on a surface of the P-type extended drain diffusion layer 203 between the reverse conductive layer 208 and the drain high concentration diffusion layer 206.

In addition, an annular field oxide film 221 is formed so as to contact with the periphery of the high concentration P-type diffusion layer 204. A surface insulating film 209 is selectively formed except a desired electrode. An aluminum wiring pattern 210, which is used as a source electrode, is formed so as to contact with the high concentration P-type diffusion layer 205 and the high concentration N-type diffusion layer 207.

Further, an aluminum-wiring pattern 211, which is used as a drain electrode, is formed so as to contact with the drain high concentration diffusion layer 206.

As shown in FIG. 5, the aluminum wiring pattern (drain electrode) 211 is partially connected to the sub-gate electrode (the second polysilicon film 202-2). Further, the reverse conductive diffusion layer 208 is partially connected to the aluminum wiring pattern (source electrode) 210.

As illustrated in FIG. 5, a parasitic PNP transistor 223 is structured by the P-type silicon substrate 220, the N-well layer 200 and the P-type extended drain diffusion layer 203. With such a structure, when the drain voltage becomes higher than the source voltage, current flows along a main current path indicated by the arrow 225 illustrated in FIG. 5.

In the meanwhile, it is to be noted that although an entire device is not illustrated in FIG. 4, the entire device has a symmetrical structure with a B axis in FIG. 4E as a center. In this condition, the field oxide film is formed in an external of the A axis in FIG. 4E, like the PMOS transistor illustrated in FIG. 5.

In this case, gate length of each of the main gates 102-1 and 202-2 is set to about 5 μm in both the NMOS transistor illustrated in FIG. 4 and the PMOS transistor illustrated in FIG. 5. This dimension is set to a minimum value within the range that the depletion layer, which is extended from the extended drain diffusion layer 103, 203, does not reach the source diffusion layer 104, 204 to occur the punch-through when the MOS transistor is put into the off-state.

Further, the distance between the main electrode 102-1, 202-2 and the sub-gate electrode 102-2, 202-2 is set to about 5 μm. This dimension is determined as follows. Namely, the depletion layer grows from both the reverse conductive diffusion layer 108, 208 and the P-type silicon substrate (NMOS) 100 or the N-well layer (PMOS) 200 to contact to each other in the pinch-off state. Thereby, the extended drain diffusion layer 103, 203 is entirely depleted. In this circumstance, the above-mentioned dimension is selected to a minimum value within the range that the depleted portion is not broken down by exceeding critical electric field.

Moreover, the dimension of the sub-gate electrode 102-2, 202-2 is set to about 3 μm. This dimension is a minimum value in such a range that the breakdown does not occur between the reverse conductive diffusion layer 108, 208 and the drain high concentration diffusion layer 106, 206.

The diffusion structure of this portion is structured by the high concentration P-type diffusion layer 108, 206 and the P-type diffusion layer or the N-type diffusion layer having low to high concentration, and the high concentration N-type diffusion layer 106, 208.

In this condition, the breakdown voltage does not almost have temperature dependency because the diffusion layer 103, 203 having low to high concentration is completely depleted (for example, see S. M. Sze, Physics of Semiconductor Devices 2nd Edition, pp. 105, FIG. 32). Therefore, the breakdown voltage is determined by only dimension of the sub-gate electrode 102-2, 202-2.

Subsequently, description will be made about a method of manufacturing a semiconductor device according to the third embodiment with reference to FIG. 6.

In the method of manufacturing the semiconductor device illustrated in FIG. 6, when the rated voltage exceeds 100V, it is necessary that a width of the sub-gate is set to about 4 μm or more. In consequence, the extended drain diffusion layer must be manufactured by the use of the ion-doping steps of twice.

Figure 6A:
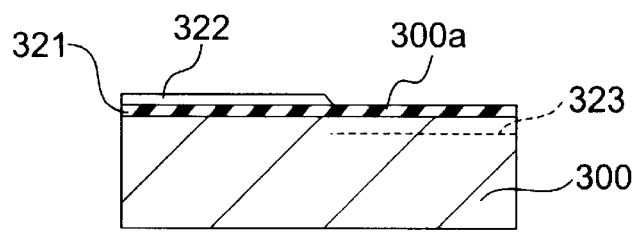
FIGS. 6A through 6E are cross sectional views showing a semiconductor device according to a third embodiment according to this invention.
Figure 6B:
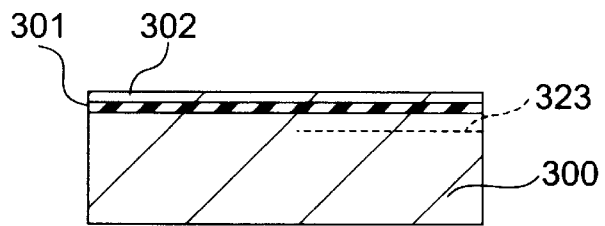
Figure 6C:
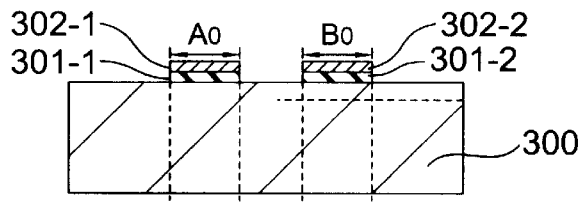

A P-type silicon (Si) substrate (thereinafter, abbreviated as a silicon substrate) 300 is first prepared, as shown in FIG. 6A. The P-type Si substrate 300 is doped boron, and has a surface orientation of (100) and resistivity of 20 Ωcm. Herein, the P-type Si substrate 300 has a principle surface 300a.

Next, an oxide film 321 having a thickness of 40 nm is deposited on an entire surface of the principle surface 300a of the P-type Si substrate 300. Successively, phosphorus ions are selectively doped by using a resist 322 as a mask.

Namely, the impurity is selectively introduced by the use of the ion doping process before a polysilicon film is formed. Thus, the phosphorus ion-doped layer 323 indicated by the dot line 323 is formed in the P-type Si substrate 300, and constitutes a part of an extended drain diffusion layer.

After the resist 322 and the oxide film 321 are entirely removed as shown in FIG. 5A, an oxide film 301 as a gate oxide film is deposited to a thickness of 0.2 μm on the principle surface 300a of the silicon substrate 300. Further, a polysilicon film 302 as a gate electrode is deposited to the thickness of the 0.4 μm thereon.

Successively, the polysilicon film 302 and the oxide film 301 are removed by the etching process by the use of the photolithography except a main gate region (a portion indicated by A0 in FIG. 6C) and a sub-gate region (a portion by indicated by B0 in FIG. 6C), as illustrated in 6C. Consequently, a first polysilicon film (a main gate electrode) 302-1 and a first oxide film (a main gate oxide film) 301-1 are left on the main gate region A0 while a second polysilicon film (a sub gate electrode) 302-2 and a second oxide film (a sub-gate oxide film) 301-2 are left on the sub-gate region B0.

In this case, the silicon substrate 300 is divided into an A1 portion of a source side and a B1 portion of a drain side using a center of the main gate region A0 as a border. Herein, the A1 portion is positioned in the opposite direction of the sub-gate region B0 while the B1 portion includes the sub-gate region B0.

Figure 6D:
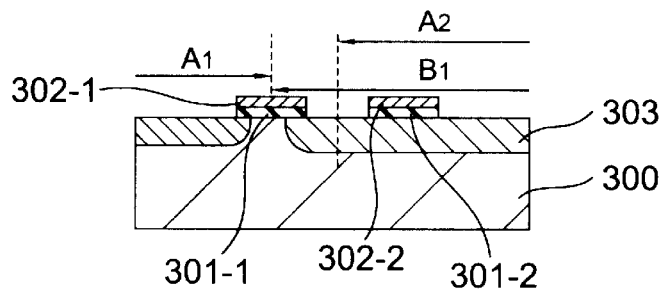
Figure 6E:
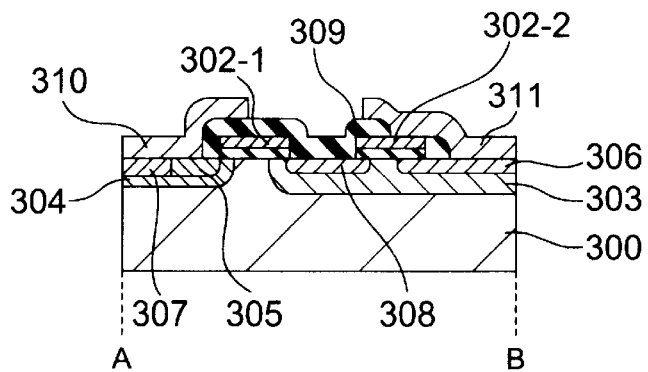

Further, a side in which the resist 322 is not formed, (namely, a side in which the phosphorous ion-doping layer 323 is formed) is defined as an A2 portion using an end portion of the resist 322 as a border in this embodiment, as shown in FIG. 6D.

Next, the A1 portion and the A2 portion are covered with a resist film (not shown) by the use of the photolithography method. In this condition, phosphorous ions are doped into a portion except the A1 portion and the A2 portion. After the resist is removed, the annealing process is carried out.

Thereby, the phosphorous ion-doping layer 323 is coupled to a layer formed by doping the phosphorous ions at this time because the phosphorous ion-doping layer 323 is formed in advance, as shown in FIG. 6A. In consequence, an N-type extended drain diffusion layer 303 is formed in the B1 portion of the silicon substrate 300, as illustrated in FIG. 6D.

Subsequently, the B1 portion is covered with a resist film (not shown) by the use of the photolithography method, and the boron ions are doped into the A1 portion. After the resist film is removed, the annealing process is carried out. Thereby, a P-type DSA (double self-alignment) diffusion layer 304 is formed in the A1 portion of the silicon substrate 300.

Thereinafter, the semiconductor device is manufactured by the same method as FIG. 4. Specifically, in the P-type DSA diffusion layer 304, a high concentration N-type diffusion layer ($N^+$ layer) 305 is formed adjacent to the main gate electrode 302-1 while a high concentration P-type diffusion layer ($P^+$ layer) 307 is formed apart from the main gate electrode 302-1.

Further, in the N-type drain diffusion layer 303, a high concentration P-type diffusion layer ($P^+$ layer) 308 is formed between the main gate electrode 302-1 and the sub-gate electrode 302-2 while a high concentration N-type diffusion layer ($N^+$ layer) 306 is formed in the opposite side of the main gate electrode 302-1.

In this case, the high concentration P-type diffusion layer 308 is called a reverse conductive diffusion layer while the high concentration N-type diffusion layer 306 is called a drain high concentration layer or a high concentration drain diffusion layer.

Thereafter, an insulating film is selectively deposited. Further, an aluminum wiring pattern 310 is formed so as to contact with the high concentration N-type diffusion layer 305 and the high concentration P-type diffusion layer 307 while an aluminum wiring pattern 311 is formed so as to contact with the drain high concentration diffusion layer 306 and the sub-gate electrode 302-2.

Namely, the aluminum-wiring pattern 310 is used as a source electrode while the aluminum-wiring pattern 311 is used as a drain electrode.

Referring to FIG. 7, description will be made about a method of manufacturing a semiconductor device according to the fourth embodiment.

In the semiconductor device illustrated in FIG. 7, a gate electrode is switched by the use of a normal digital signal of a low voltage between 0V and 5V. In this event, a signal between 0V and 5V is applied to a main gate electrode. It is necessary that a threshold value is set a considerably small level (1V or less) to switch the gate electrode. To obtain this threshold value, a thickness of the main gate oxide film must be thinned to about several tens nm.

In contrast, a sub-gate oxide film is sandwiched between a reverse conductive diffusion layer, which has the same potential as a source region, and a sub-gate electrode, which has the same potential as the drain. Therefore, the film thickness, which has a margin for a safety for the rated voltage of 80 V, is required. In this case, the thickness is equal to about 200 nm (0.2 μm). Thus, it is required that the main gate oxide film is different from the sub-gate oxide film in the thickness.

Figure 7A:
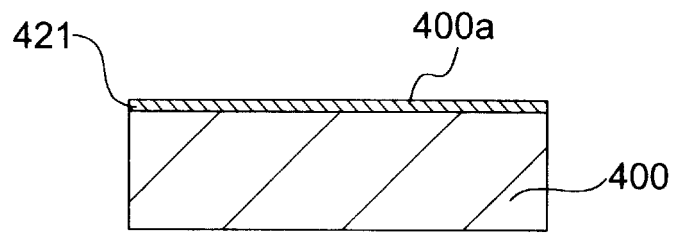
FIGS. 7A through 7E are cross sectional views showing a semiconductor device according to a fourth embodiment according to this invention.

A P-type silicon (Si) substrate (thereinafter, abbreviated as a silicon substrate) 400 is first prepared as shown in FIG. 7A. The P-type Si substrate 400 is doped boron, and has a surface orientation of (100) and resistivity of 20 Ωcm. Herein, the P-type Si substrate 400 has a principle surface 400a.

Next, an oxide film (sub-gate oxide film) 421 is formed by oxidizing process with an oxide film thickness necessary to a sub-gate on an entire surface of the principle surface 400a of the P-type Si substrate 400. In this event,the oxide film 421 has the thickness of 0.2 μm.

Figure 7B:
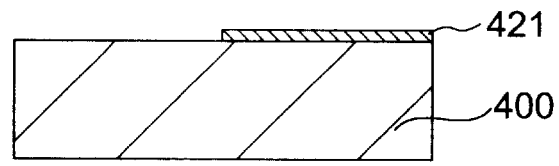

Subsequently, the oxide film 421 is selectively etched for the main gate region, as illustrated in FIG. 7B.

Figure 7C:
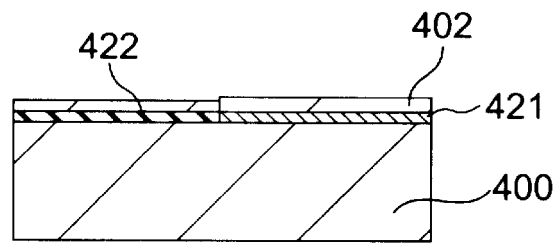

Thereinafter, an oxide film (a main gate oxide film) 422 of 20 nm is deposited by oxidizing process for the main gate region. Further, a polysilicon film 402 is deposited thereon, as illustrated in FIG. 7C. In this case, although the sub-gate region is also oxidized, growth rate of the sub-gate region is considerably slower than that of the main gate region because the thick oxide film is originally formed. Herein, it is to be noted that the thickness of the polysilicon film 402 is 0.4 μm.

Figure 7D:
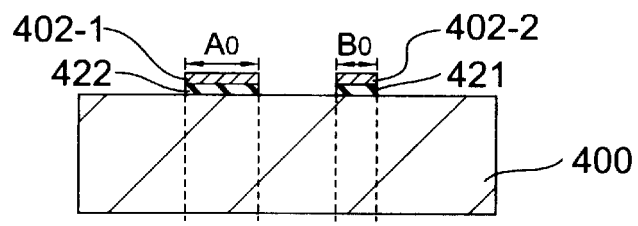
Figure 7E:
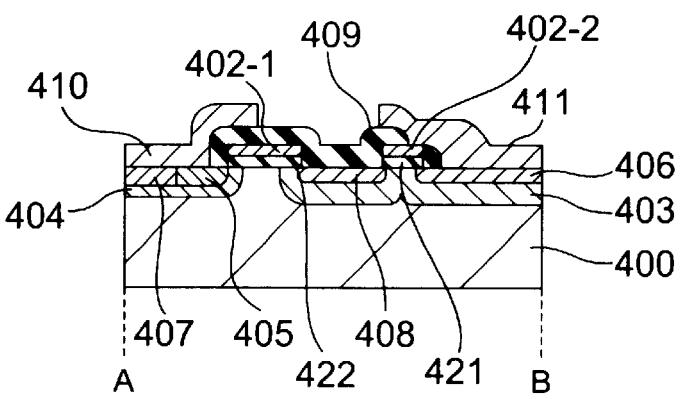

Subsequently, the polysilicon film 402 and the oxide film 422, 421 are removed except the main gate region and the sub-gate region, as illustrated in FIG. 7D. Thereby, a first polysilicon film (a main gate electrode) 402-2 and a first oxide film (a main gate oxide film) 422 having the thickness of 20 nm is left on the main gate region A0 while a second polysylicon film (a sub-gate electrode) 403-2 and a second oxide film (a sub-gate oxide film) 421 having the thickness of 204 nm is left on the sub-gate region B0.

Thereinafter, the semiconductor device is manufactured by the same method as that of FIG. 4. Specifically, an N-type extended drain diffusion layer 403 is formed in the silicon substrate 400, and a P-type DSA diffusion layer 404 is formed in the opposite side thereof.

In the P-type DSA diffusion layer 404, a high concentration N-type diffusion layer ($N^+$ layer) 405 is formed adjacent to the main gate electrode 402-1 while a high concentration P-type diffusion layer ($P^+$ layer) 407 is formed apart from the main gate electrode 402-1.

Further, in the N-type drain diffusion layer 403, a high concentration P-type diffusion layer ($P^+$ layer) 408 is formed between the main gate electrode 402-1 and the sub-gate electrode 402-2 while a high concentration N-type diffusion layer (N⁺ layer) 406 is formed in the opposite side of the main gate electrode 402-1.

In this case, the high concentration P-type diffusion layer 408 is called a reverse conductive diffusion layer while the high concentration N-type diffusion layer 406 is called a drain high concentration layer or a high concentration drain diffusion layer.

Thereafter, an insulating film is selectively deposited. Further, an aluminum wiring pattern (a source electrode) 410 is formed so as to contact with the high concentration N-type diffusion layer 405 and the high concentration P-type diffusion layer 407 while an aluminum wiring pattern 411 (a drain electrode) is formed so as to contact with the drain high concentration diffusion layer 406 and the sub-gate electrode 402-2.

Subsequently, description will be made about a drive device using the semiconductor device according to this invention.

As mentioned before, there is generally a trade-off relationship between the breakdown voltage between the source region and the drain region and the on-resistance characteristic. The semiconductor device according to this invention has the excellent breakdown voltage and the on-resistance characteristic. When the semiconductor device is put into the off state, the extended drain diffusion layer is depleted from both the upper side and the lower side. Thereby, the extended drain diffusion layer can have higher impurity concentration. Therefore, the on-resistance in the on state can be reduced because the impurity concentration of the extended drain diffusion layer is relatively high.

Various reports have been made about this fact (for example, see. NEC Res. & Develop. Vol.35, No.4, October 1994, 'Double RESURF Device Technology for Power ICs'; Japanese Unexamined Patent Publication (JP-A) Sho. 55-108773; U.S. Pat. Nos. 4,300,150; and 4,811,075).

However, these conventional techniques are directed only to improve the breakdown voltage and the on-resistance. In consequence, the reverse conductive diffusion layer is merely fixed to the same potential as the source electrode by the use of the wiring pattern of the diffusion layer except a device active portion.

Alternatively, the reverse conductive diffusion layer is put into the open-state in which no electrode is taken out. Instead, a backward bias is applied to the reverse conductive diffusion layer to flow no current.

Referring to FIG. 4, when attention is paid for structure in the drain diffusion layer, a diode is structured by the drain electrode and the reverse conductive diffusion layer 108. A resistance in a forward direction of the diode becomes considerably small in comparison with continuity resistance (on-resistance) between the source region and the drain region in the on state or a resistance in the forward direction of a parasitic diode between the drain electrode and the source electrode. This fact is assumed from the viewpoint of a cross sectional structure. In this event, the resistance can be reduced to about ⅕ or less.

In the semiconductor device according to this invention, a diode, which has excessively small operation resistance, is contained in the extended drain diffusion layer of the conventional double resurf structure. This diode is positively used even when the diode is forwardly biased. To this end, an electrode is taken out from the reverse conductive diffusion layer via an electrical contact with an ohmic metal to retain the above-mentioned advantage, and serves as an independent terminal.

Figure 8:
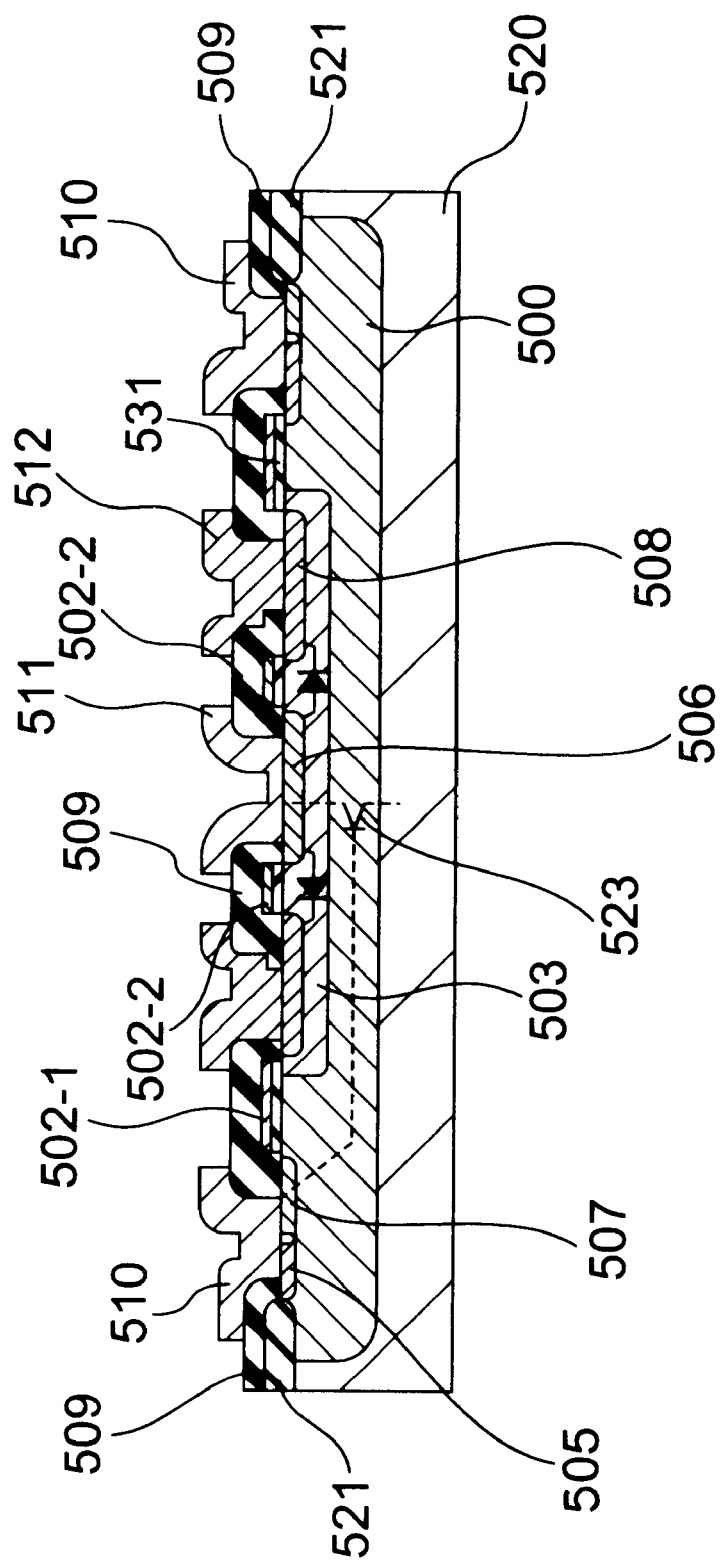
FIG. 8 is a cross sectional view showing a fifth embodiment according to this invention.

Referring to FIG. 8, description will be made about a semiconductor device having the above-mentioned structure according to a fifth embodiment. Herein, the semiconductor device according to the fifth embodiment is manufactured by the use of either of the manufacturing methods illustrated in FIG. 5 through FIG. 8 except an n-well.

As illustrated in FIG. 8, the semiconductor device according to the fifth embodiment is a lateral type MOSFET which has an extended drain diffusion layer 503 for specification of high breakdown voltage. The semiconductor device has an N-well 500 in a P-type semiconductor substrate 520. A main gate electrode 502-1 of a polysilicon film is formed via a main gate oxide film on a surface of the N-well 500 while a sub-gate electrode 502-2 of the polysilicon film is formed via a sub-gate oxide film on the surface.

Further, the extended drain diffusion layer 503 is formed in the self-alignment manner with the main gate electrode 502-1. In this condition, a reverse conductive diffusion layer 508, which has a conductive type opposite to that of the extended drain diffusion layer 503, is formed in the extended drain diffusion layer 503 and between a drain high concentration diffusion layer 506 and the gate region. It is to be noted that the reverse conductive diffusion layer 508 may be referred to as a TOP diffusion layer.

A source diffusion layer 507 and an N-type diffusion layer 505 are formed between the main gate electrode 502-1 and the field oxide film 521 apart from the extended drain diffusion layer 503 in the N-well 500. Further, the reverse conductive diffusion layer 508 is formed in the self-alignment manner with the main gate electrode 502-1 and the sub-gate electrode 502-2 in the extended drain diffusion layer 503.

The reverse conductive type diffusion layer 508 has an ohmic electrical contact with a metal film 512 on the surface. Further a P-type high concentration drain diffusion layer 506 is formed in the self-alignment manner with the sub-gate electrode in the extended drain diffusion layer 503. In this event, the high concentration drain diffusion layer 506 has higher impurity concentration than that of the extended drain diffusion layer 503. The high concentration drain diffusion layer 506 is connected to a drain electrode 511. A metal electrode 510 (serving as a source electrode) and an isolating film 509 are provided as shown in FIG. 8.

A metal film 512, such as, aluminum is connected to the reverse conductive type diffusion layer 508 as an independent electrode. In this case, the independent electrode serves as an independent terminal, like a source terminal, a drain terminal and a gate terminal. Herein, the independent terminal is referred to as a DA terminal in an NMOS while it is referred to as a DK terminal in a PMOS.

As mentioned before, the semiconductor device according to the fifth embodiment of this invention is the insulating gate type electrical filed effect transistor for specification of high breakdown voltage. The semiconductor device has the reverse conductive type diffusion layer in the extended drain diffusion layer. Further, the reverse conductive type diffusion layer has the ohmic electrical contact with the metal wiring pattern. In this condition, the independent terminal is directly taken out from the metal wiring pattern on the surface of the semiconductor device with low resistance.

Referring to FIG. 8, a deep N-well having a depth of about 10 µm is placed in the P-type semiconductor substrate 520 having resistivity of about 15 Ωcm in the semiconductor device according to the fifth embodiment. Thus, the PMOS device is formed in the N-well 500. In this event, the P-type extended drain diffusion layer 503 has a depth of about 3 µm to 4 µm. Further, the reverse conductive type diffusion layer 508 having the depth of about 1 μm and the P-type high concentration drain diffusion layer 506 are formed in the P-type extended drain diffusion layer 503.

In this case, the reverse conductive type diffusion layer 508 has the ohmic electrical contact with the aluminum film 512 on the surface of the P-type semiconductor substrate 520. This aluminum terminal 512 serves as an anode electrode of a diode in the drain diffusion layer 503, and is taken out to the external of the semiconductor device as the DK terminal independent of the source terminal, the drain terminal and the gate terminal.

In this event, when the conductive type of the diffusion layer is reversed in the condition that the N-well 500 is not formed, the semiconductor device corresponds to the NMOS. In this condition, the aluminum film, which has the ohmic electrical contact with the reverse conductive type diffusion layer, serves as cathode electrode of the diode contained in the drain diffusion layer, and is taken out as the DA terminal to the external of the semiconductor device.

Figure 9:
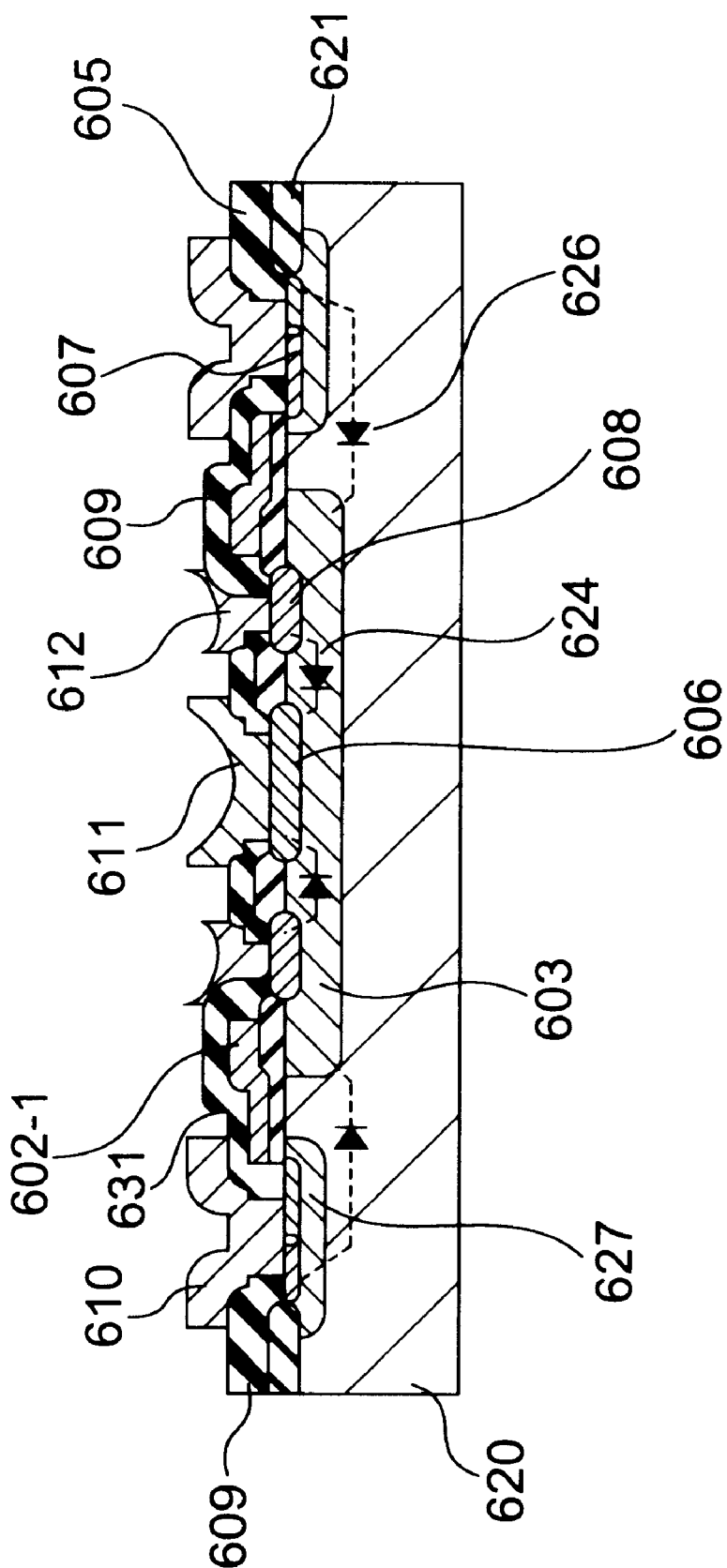
FIG. 9 is a cross sectional view showing a sixth embodiment according to this invention.

Referring to FIG. 9, description will be made about a semiconductor device according to a sixth embodiment. Herein, the semiconductor device according to the sixth embodiment is manufactured by the use of either of the manufacturing methods illustrated in FIG. 4 through FIG. 7.

The semiconductor device illustrated in FIG. 9 corresponds to an NMOS, and is largely different from the semiconductor device illustrated in FIG. 8 in arrangement of the field oxide film and the polysilicon film on a surface of a P-type semiconductor substrate 620 due to the difference of the method of manufacturing the semiconductor device. The semiconductor device in FIG. 9 is almost equivalent with the device in FIG. 6 in the other structure.

In the above semiconductor device in FIG. 9, a gate electrode 602-1 of a polysilicon film is formed via a gate oxide film on a surface of the P-type semiconductor substrate 620. Further, a reverse conductive type diffusion layer 608, which has a conductive type opposite to an extended drain diffusion layer 603 (N type conductivity), is formed in the extended drain diffusion layer 603 and between the field oxide films 621. Herein, it is to be noted that the reverse conductive type diffusion layer 608 may be thereinafter referred to as a TOP diffusion layer.

A N-type source diffusion layer 607 and a P-type contact diffusion layer 627 are formed apart from the extended drain diffusion layer 603 and between the gate electrode 602-1 and the field oxide film 621. The reverse conductive type diffusion layer 608 has an ohmic electrical contact with a metal layer 612 on the surface. Further an N-type high concentration drain diffusion layer 606 is formed in the self-alignment manner with the field oxide film in the extended drain diffusion layer 603. Herein, the high concentration drain diffusion layer 606 has a higher impurity concentration than that of the extended drain diffusion layer 603. The high concentration drain diffusion layer 606 is connected to the drain electrode 611.

A metal layer 612, such as, aluminum is connected to the reverse conductive diffusion layer 608 as an independent electrode. This independent electrode serves as an independent terminal, like the source terminal, the drain terminal and the gate terminal. Herein, it is to be noted that the independent terminal is referred to as a DA terminal in the NMOS type while it is referred to as a DK terminal in the PMOS type.

When an N-well having the depth of about 10 μm is formed in the semiconductor device and the conductive type of the diffusion layer is reversed, the device corresponds to the PMOS. In this case, the aluminum film, which has the ohmic electrical contact with the reverse conductive type diffusion layer in the N-type extended drain diffusion layer, becomes an anode electrode of the diode contained in the drain diffusion layer. Thereby, the aluminum film is taken out as the DK terminal to the external of the semiconductor device.

Figure 10:
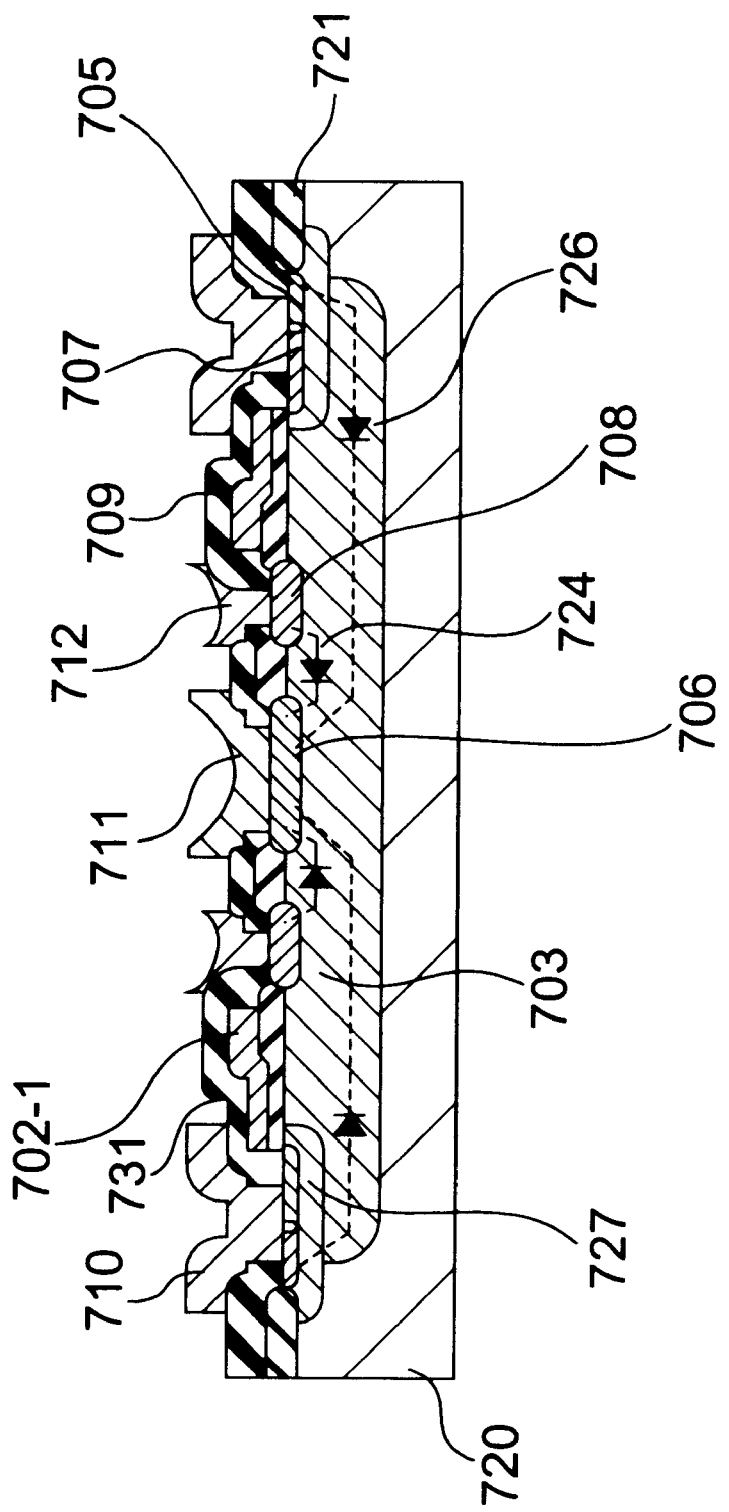
FIG. 10 is a cross sectional view showing an seventh embodiment according to this invention.

Referring to FIG. 10, description will be made about a semiconductor device according to a seventh embodiment.

A p-type semiconductor substrate 720 is doped boron ions and has resistivity of 20 Ωcm. An N-type extended drain diffusion layer 703 having the depth of 5 μm is formed so as to reach the N-type source diffusion layer 707 by the use of the ion implantation of phosphorus and the thermal process on the above P-type semiconductor substrate 720.

As illustrated in FIG. 10, an N-type high concentration drain diffusion layer 706, a reverse conductive type diffusion layer 708 in the N-type extended drain diffusion layer 703, and an N-type source diffusion layer 707 are formed in the N-type extended drain diffusion layer 703 and on the surface of the semiconductor substrate 720. Herein, each of the diffusion layers has the depth of about 0.5 to 1.0 μm. A P-type conductivity layer 727 is provided as a base diffusion layer as shown in FIG. 10.

A P-type contact diffusion layer 705 is formed adjacent to the N-type source diffusion layer 707. In this event, the diffusion layer partially sticks out from the N-type extended drain diffusion layer 703.

The gate electrode 702-1 is formed on a gate oxide film having the thickness of 0.4 μm in a side of the source diffusion layer 707 and is placed on the field oxide film 721 of the thickness of 0.1 μm in the side of the drain diffusion layer 706.

A drain terminal 711, a DA terminal 712, and a gate terminal are taken out from the N-type high concentration drain diffusion layer 706, the reverse conductive diffusion layer 708 in the N-type extended drain diffusion layer, and the gate electrode 702 with the ohmic electrical contact, respectively.

Likewise, a source terminal 710 is taken out so as to form the ohmic contact with both the N-type source diffusion layer 707 and the P-type contact diffusion layer 705 on the surface of the semiconductor substrate.

Subsequently, description will be made about a driving circuit using a semiconductor device of this invention. The driving circuit utilizes the above-mentioned semiconductor device, and is designed so as to have the following two steps during operation duration.

Namely, the semiconductor device is put into an off state in a first state. Further, when breakdown voltage between the drain region and the source region is necessary, the backward bias is applied to a diode contained in the drain diffusion layer in order to ensure the breakdown voltage. To this end, the bias is applied between the drain terminal and the DK terminal in the PMOS structure while the bias is applied between the drain terminal and the DA terminal in the NMOS structure. Alternatively, the DK terminal may be put into an open-state in the PMOS structure while the DA terminal may be put into the open-state in the NMOS structure.

On the other hand, current flows in the forward direction for the diode contained in the drain in a second state during entire duration or a part of the duration.

Thus, the backward bias is applied to the contained diode during the duration requiring high drain breakdown voltage between the source region and the drain region in the first state. Further, the current intentionally flows in the forward direction for the contained diode during the entire duration or a part of the duration in the second state.

Subsequently, description will be made about detail driving circuit with reference to FIGS. 11 and 12.

The driving circuit is composed of a first output CMOS circuit, a second output CMOS circuit, a third output CMOS circuit, a power recovering portion and an EL panel portion 860. Each of the first to third output CMOS circuits is composed of PMOS portions 820-1, 820-2 and 820-3 and NMOS portions 821-1, 821-2 and 821-3.

Each of the PMOS portions is composed of a PMOSFET 811-1, a parasitic PNP transistor 815-1 and a contained diode 816-1. In this event, the cathode of the contained diode 816-2 is connected to the DK line. The source of the PMOSFET 811-1 in the PMOS portion is connected to a power supply line (namely, VDD line).

Each of the NMOS portions is composed of a FET 812-1, a parasitic diode 814-1 between the drain and source, and the contained diode 814-1. In this case, the anode of the contained diode is connected to the DA line. The source of an NMOSFET 812-1 in the NMOS portion is connected to a power supply line (VSS line). The drain of the PMOSFET 811-1 in the PMOS portion and the drain of the NMOSFET 812-1 in the NMOS portion are connected to a capacitor Cp1 in the EL panel 860 via a first output and a first panel terminal in common.

Figure 11:
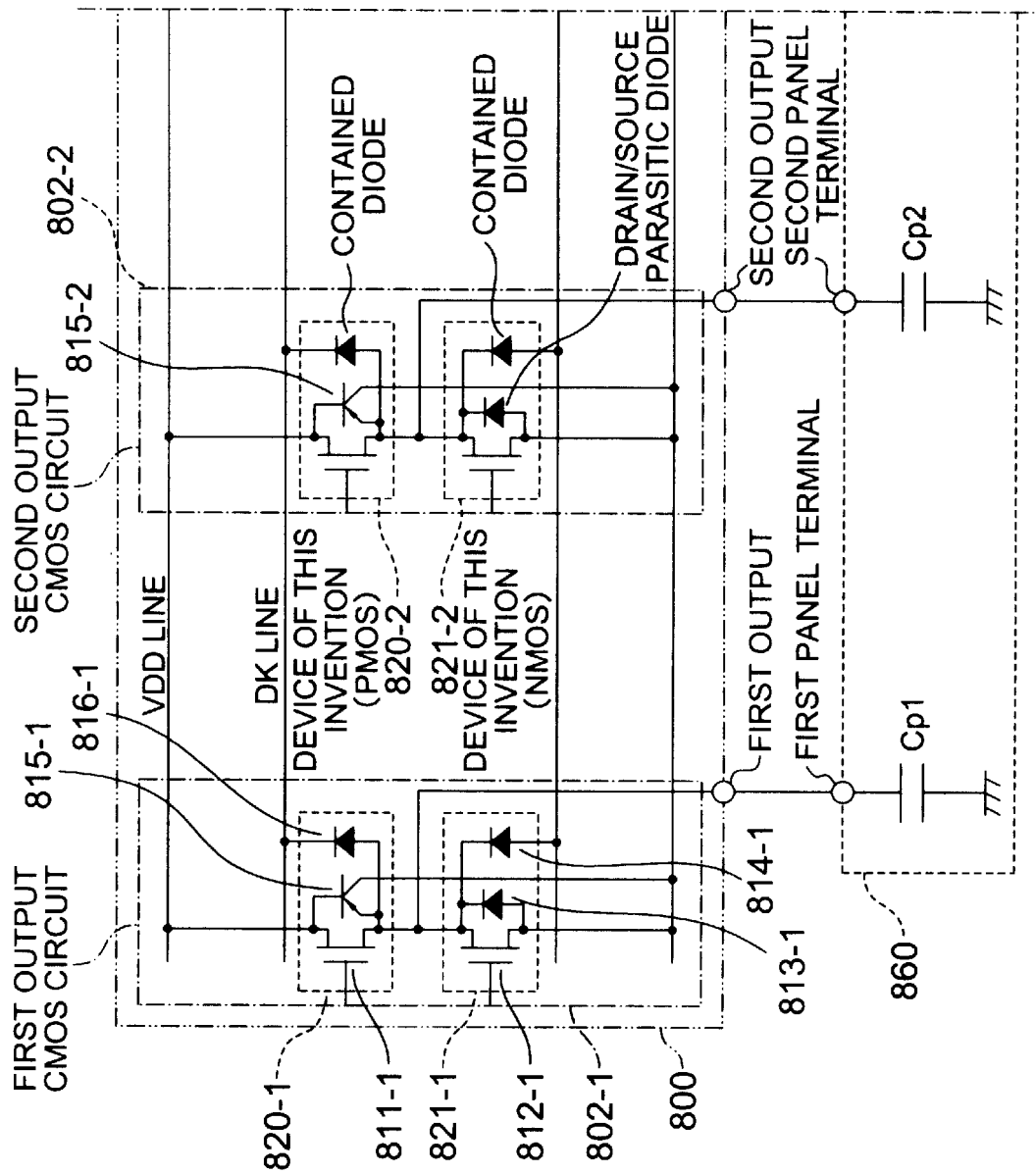
FIG. 11 is a block diagram showing a circuit structure of a driving device of this invention.
Figure 12:
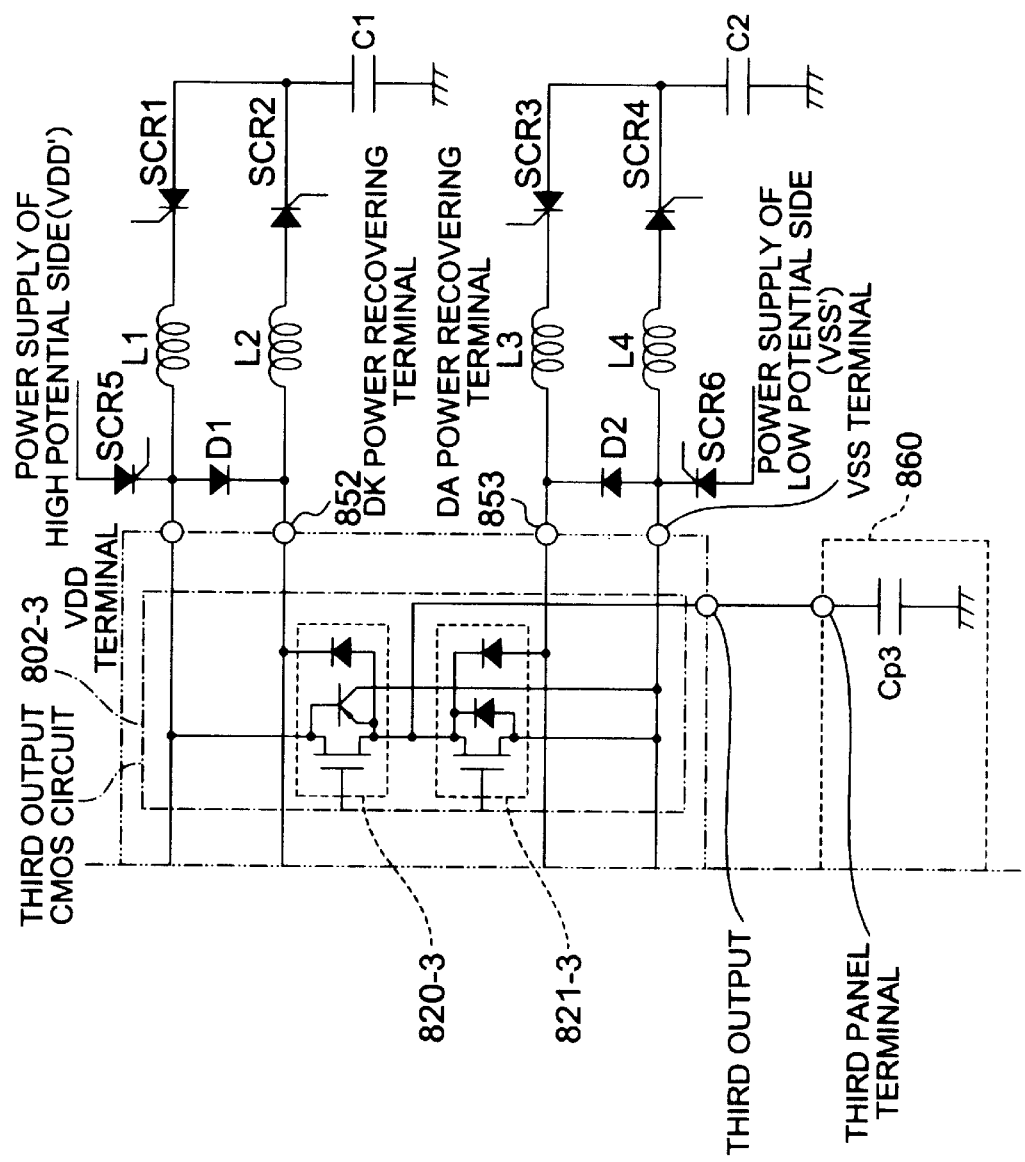
FIG. 12 is also a block diagram showing a circuit structure of a driving device of this invention.

Further, the semiconductor device corresponding to the PMOS type and the semiconductor device according to the PMOS type are connected to each other with the CMOS structure in the driving circuit illustrated in FIGS. 11 and 12, like the known normal CMOS circuit. Namely, the source terminal of the PMOS type is connected to the VDD line while the source terminal of the NMOS type is connected to the VSS line. The respective drain terminals are connected to each other, and are taken out as an output terminal to the external.

Moreover, the DK terminal of the PMOS type is connected to the DK line while the DA terminal of the NMOS type is connected to the DA line. Each of the first to third out puts CMOS circuits illustrated in FIGS. 11 and 12 correspond to this.

Although an input side circuit of each gate is not illustrated, a CMOS signal control circuit of low voltage system (normally, 5V) and a potential converting circuit of low and high voltage is structured on the same chip as the driving circuit.

Further, although the number of the outputs is three in FIGS. 11 and 12, the number is practically several hundreds, as mentioned before. Therefore, an integrated circuit for these outputs can not be realized on one semiconductor chip. As a result, the driving circuit is structured by a plurality of chips as several tens of outputs per one semiconductor chip. In this case, although description is made about only component factors of the first output CMOS circuit, the description is the same in the second and third output CMOS circuits.

Each of C1 and C2 denotes a capacitor, each of L1 to L4 denotes a reactor, each of D1 and D2 denotes a diode, and each of SCR1 through SCR6 denotes a thyristor in a control circuit (power supply recovering circuit) for controlling the power supply supplied to the semiconductor circuit. They entirely control to supply the power supply for the CMOS circuit (the third CMOS circuit in FIGS. 11 and 12) having the first to several hundredth output. Consequently, only one device is required.

Subsequently, description will be made about a driving circuit of this invention.

In an operation of the EL panel, scanning line electrodes are sequentially activated so as to be scanned from an upper side to a lower side of the display. The operation is repeated. Namely, this operation means that the operation (positive electrode charge of the capacitor Cp1→retaining→discharge of the capacitor Cp1→positive electrode charge of the capacitor Cp2→retaining→discharge of the capacitor Cp2→positive electrode charge of the capacitor Cp3→retaining→discharge of the capacitor Cp3) is repeated.

A pixel designated on the scanning line electrode, which is positively charged during the retaining duration, emits based upon an image data. Namely, the opposite data line electrode is negatively charged.

In this repeating operation, the scanning line electrodes are sequentially transferred. In this event, the scanning line electrode is activated as an active scanning line electrode is charged with charge power (0.5*Cp*the square of the charged voltage). In general, the power is not abandoned to reduce consumption power during discharge, and is recovered to charge the subsequent electrode.

In this condition, the power supply line of a high potential side is set to VDD'=230V in potential while the power supply line of a low potential side is set to VSS'=0V in potential.

First, description will be made about a step for positively charging the capacitor Cp1.

The thyristors SCR5, SCR6 and the PMOS type device 811-1 of the first output CMOS circuit 802-1 are set to the on-state while the NMOS type device 812-1 of the first output CMOS circuit, the PMOS type devices of the second and third output CMOS circuits are set to the off-state. At this time, the current path becomes the power supply of the high potential side (VDD')→thyristor SCR5→PMOS type device of the first output CMOS circuit→the first output CMOS circuits the first panel terminal→the capacitor Cp1. Consequently, the capacitor Cp1 is charged.

At this time, the voltage of 230 V is also applied to the PMOS type devices of the second and third output CMOS circuits 802-2 and 802-3 in the off state. Therefore, high breakdown voltage between the drain and the source, which has a margin for this, is required. To this end, the backward bias is applied to the diodes 816-2 and 816-3 contained in the drains of the respective devices through the thyristor SCR5 and the diode D1. Thereby, the necessary breakdown voltage between the drain and the source is kept constant.

Subsequently, description will be made about the discharge from the capacitor Cp1.

The PMOS type device of the first output CMOS circuit 802-1 is switched to the off state while the thyristor SCR2 is switched to the on state. When the thyristor SCR2 is turned on, the- current path of the discharge becomes the capacitor Cp1→the contained diode (forward direction) of the PMOS type device of the first output CMOS circuit→the DK line→the DK electrical power recovering terminal→the reactor L2→the thyristor SCR2→the capacitor C1.

In this event, the terminal voltage of the first panel terminal is determined by the following equation due to the existence of L2.

$$\text{initial voltage}[230\ V]\times\cos(\omega 1\times t)$$

$$(\omega 1 = 29\ [(C1+Cp1)/L2\times C1\times Cp1])$$

After the discharge starts, the thyristor SCR2 is set to the off-state at the timing (after $\pi/2\omega 1$) in which the terminal voltage of the first panel terminal initially becomes zero. When the thyristor is set to the off state at this timing, the electric power charged in the capacitor Cp1 is transferred to the capacitor C1. In practical, there is loss due to resistance component of the current path or a load, which relates to the electrical power transfer efficiency.

Subsequently, description will be made about the discharge process to the capacitor Cp2.

The thyristor SCR5, the PMOS type devices 811-1, 811-3 of the first and third output CMOS circuits 802-1, 802-3 and the NMOS type device of the second output CMOS circuit are set to the off-state while the PMOS device of the second output CMOS circuit is set to the on-state. In this event, the thyristor SCR1 is turned on.

At this time, the discharge current flows through the thyristor SCR1→reactor L1→the PMOS type device of the second output CMOS circuits→the second outputs→the second panel terminal→the capacitor Cp2.

In this event, the terminal voltage of the capacitor C1 is determined by the following equation.

(initial voltage[230 V]×Cp1/C1)×cos(ω2×t)

(ω2=√[(C1+Cp2)/L1×C1×Cp2])

The thyristor is turned off at the timing (after π/2ω2) in which is initially set to zero after the thyristor SCR1 is turned on. At this time, the terminal voltage of the capacitor Cp2 becomes the initial voltage [230V] when the circuit has no loss. In practical, there is loss caused by the resistance component of the current path and the load when the electric power of the capacitor Cp1 is transferred to the capacitor C1 and when the electric power of the capacitor C1 is transferred to the capacitor Cp2. The SCR5 is turned on at the same time that the charge to the Cp2 is completed to compensate the loss. Thereby, the electric power is supplied from the power supply (VDD) of the high potential side.

In the process, the backward bias is applied to the contained diode of the PMOS type device in the first and third output CMOS circuits. Thereby, the breakdown voltage between the source and the drain is kept constant.

The subsequent process (the charge state retaining of the capacitor Cp2→discharge of the capacitor Cp2→the positive electrode charge to the capacitor Cp3→retaining→the discharge of the capacitor Cp3) is carried out in the same manner. In this case, the thyristors SCR3 and SCR4 are set to the off state during the above-mentioned duration.

As mentioned above, description has been made about the positive electrode writing mode to the capacitors Cp1 through Cp3. The positive electrode writing mode is alternately performed with the negative electrode writing mode in the EL display of the alternating drive.

In the case of the negative electrode writing mode, the potential of the power supply of the high potential side is set to VDD'=0 while the power supply of the low potential side is set to VSS"=−180 V. In the first through third CMOS circuits, the description of the on and off states are changed between the PMOS type device and the NMOS type device to each other. Further, the description related the external circuit for controlling the power supply is replaced by SCR5→SCR6, D1→D2, L1→L4, L2→L3, SCR1→SCR4, SCR2→SCR3, C1→C2.

The semiconductor device of this invention has the excellent breakdown voltage between the drain and the source and the excellent on-resistance. Further, the diode, which has excessively small operation resistance, can be simultaneously formed for the drain electrode without increasing the device area (the cathode terminal in the PMOS type, the anode terminal in NMOS type).

The circuit of this invention can utilize the diode contained in the drain which has the both effects of the above semiconductor device. The both effects mean that the breakdown voltage/on-resistance characteristic is excellent, and the operation resistance is extremely low without new device region. In particular, when the semiconductor device of this invention is utilized for the above-mentioned switching device for driving the EL display, the charging time and the electric power loss can be reduced because the on-resistance characteristic is excellent during charging to the load.

Moreover, the discharging time of the load and the electric power loss can be reduced because the operation resistance of the contained diode is small. These effects can be achieved with new chip occupied area.

Further, when the conductive types of the semiconductor substrate, the well and the diffusion layer are opposite to each other, the parasitic bipolar transistor is inevitably formed like the conventional case, as shown in FIG. 8. The parasitic bipolar transistor is illustrated as an equivalent circuit in FIG. 10.

When the parasitic bipolar transistor is used as the switching device for driving the EL display as illustrated in FIG. 10, the collector current, which will become reactive power, inevitably flows to the Vss side from the viewpoint of the electric power recovering so as to reduce the efficiency of the electric power recovering.

However, the operation resistance of the contained diode is small to about ⅕ as compared to the operation resistance of the forward direction between the base and the emitter of the parasitic bipolar transistor, and the terminal is independently taken out according to semiconductor device of this invention. In consequence, the above-mentioned adverse effect due to the parasitic bipolar transistor can be eliminated.

Even when the forward bias is applied for the drain electrode and the source electrode, the minority carriers, which is injected from the drain diffusion layer into the well are suppressed if the same or higher forward bias is applied for the contained diode.

In the conventional semiconductor device for driving the EL display, the structure, which requires the complicated process, must be inevitably adopted to suppress the current amplification factor of the parasitic bipolar transistor. In this event, the complicated structure includes the buried epitaxial layer structure in which the epitaxial growth is carried out on the high concentration antimony layer, and the insulator separating structure in which the active layer is formed on the buried insulating film.

However, when the device of this invention is adopted as the device for driving the EL display, the semiconductor device can be realized by the self-separating structure using the simple process in which the impurity is introduced from only the surface of the semiconductor substrate.

What is claimed is:

1. A semiconductor device having a substrate comprising:
   a source diffusion layer which is formed in said substrate;
   an extended drain diffusion layer which is formed in said substrate;
   a drain diffusion layer which is formed in said extended drain diffusion layer;
   a reverse conductive type diffusion layer which is formed adjacent to said drain diffusion layer in said extended diffusion layer, and extending to a surface of said substrate, said reverse conductive type diffusion layer having a conductive type opposite to that of said extended drain diffusion layer;
   a main gate region which is formed between said source diffusion layer and said extended drain diffusion layer and on said substrate;

a sub-gate region which is formed between said reverse conductive type diffusion layer and said drain diffusion layer and on said extended drain diffusion layer, wherein said sub-gate region is formed over at least half of a distance between said reverse conductive type diffusion layer and said drain diffusion layer on said extended drain diffusion layer, a source electrode which is placed on said source diffusion layer; and a drain electrode, formed separately from a sub-gate electrode, said drain electrode placed in said drain diffusion layer and contacting said sub-gate electrode, wherein said main gate region is composed of a main gate oxide film and a main gate electrode formed thereon while said sub-gate region is composed of a sub-gate oxide film with said sub-gate electrode formed thereon.

2. A device as claimed in claim 1, wherein:

a diffusion self-alignment (DSA) diffusion layer is formed in said substrate; and said source diffusion layer is placed in said DSA diffusion layer.

3. A device as claimed in claim 1, further comprising;

an insulating film which is formed on said main gate region and a part of said sub-gate region.

4. A device as claimed in claim 1, further comprising:

a terminal electrode which is placed on said reverse conductive type diffusion layer, said terminal electrode being used as an independent terminal.

5. A device as claimed in claim 4, wherein:

a diode is formed between said reverse conductive type diffusion layer and said drain diffusion layer.

6. A device as claimed in claim 1, wherein:

said drain diffusion layer is contained in said extended drain diffusion layer.

7. A device as claimed in claim 1, wherein:

said main gate region has a thickness different from said sub-gate region.

8. A device as claimed in claim 7, wherein:

the thickness of said sub-gate region is larger than that of said main gate region.

9. A semiconductor device which has a substrate having a first conductive type comprising:

a well region which is formed in said substrate, said well region having a second conductive type opposite to said first conductive type;

a source diffusion layer which is formed in said well region;

an extended drain diffusion layer which is formed in said well region, said drain extended diffusion layer having the first conductive type;

a drain diffusion layer which is formed in said extended drain diffusion layer;

a reverse conductive type diffusion layer which is formed adjacent to said drain diffusion layer in said extended drain diffusion layer, and extends to a surface of said substrate, said reverse conductive type diffusion layer having the second conductive type;

a main gate region which is formed between said source diffusion layer and said extended drain diffusion layer and on said well region;

a sub-gate region which is formed between said reverse conductive type diffusion layer and said drain diffusion layer and on said extended drain diffusion layer, wherein said sub-gate region is formed over at least half of a distance between said reverse conductive type diffusion layer and said drain diffusion layer on said extended drain diffusion layer, a source electrode which is placed on said source diffusion layer; and a drain electrode, formed separately from a sub-gate electrode, said drain electrode placed on said drain diffusion layer and contacting said sub-gate electrode, wherein said main gate region is composed of a main gate oxide film and a main gate electrode formed thereon while said sub-gate region is composed of a sub-gate oxide film with said sub-gate electrode formed thereon.

10. A device as claimed in claim 9, wherein:

a diffusion-self alignment (DSA) diffusion layer is formed in said well region, and said source diffusion layer is placed in said DSA diffusion layer.

11. A device as claimed in claim 9, further comprising;

an insulating film which is formed on said main gate region and a part of said sub-gate region.

12. A device as claimed in claim 9, wherein;

a parasitic bipolar transistor is formed in said extended drain diffusion layer.

13. A device as claimed in claim 9, further comprising:

a terminal electrode which is placed on said reverse conductive type diffusion layer, said terminal electrode being used as an independent terminal.

14. A device as claimed in claim 13, wherein:

a diode is formed between said reverse conductive type diffusion layer and said drain diffusion layer.

* * * * *